US012710496B2

(12) United States Patent
Hugon et al.

(10) Patent No.: US 12,710,496 B2
(45) Date of Patent: Aug. 18, 2026

(54) PERMANENT MAGNET ASSEMBLY FOR MAGNETIC RESONANCE IMAGING WITH NON-FERROMAGNETIC FRAME

(71) Applicant: Hyperfine Operations, Inc., Guilford, CT (US)

(72) Inventors: Cedric Hugon, Guilford, CT (US); Michael Stephen Poole, Guilford, CT (US)

(73) Assignee: Hyperfine Operations, Inc., Guilford, CT (US)

(*) Notice: Subject to any disclaimer, the term of this patent is extended or adjusted under 35 U.S.C. 154(b) by 0 days.

(21) Appl. No.: 18/133,995

(22) Filed: Apr. 12, 2023

(65) Prior Publication Data

US 2023/0324482 A1 Oct. 12, 2023

Related U.S. Application Data

(63) Continuation of application No. 17/116,540, filed on Dec. 9, 2020, now Pat. No. 11,656,308.

(Continued)

(51) Int. Cl.

*G01R 33/383* (2006.01)
*G01R 33/38* (2006.01)

(Continued)

(52) U.S. Cl.

CPC ....... *G01R 33/383* (2013.01); *G01R 33/3802* (2013.01); *G01R 33/3858* (2013.01); *G01R 33/445* (2013.01)

(58) Field of Classification Search

CPC ............ G01R 33/3873; G01R 33/3802; G01R 33/383; G01R 33/3858; G01R 33/445; H01F 7/0278

See application file for complete search history.

(56) References Cited

U.S. PATENT DOCUMENTS 4,498,048 A * 2/1985 Lee ...................... G01R 33/383 324/309
4,727,327 A * 2/1988 Toyoshima ........ G01R 33/3873 324/309

(Continued)

FOREIGN PATENT DOCUMENTS

| | | |
|---|---|---|
| CN | 1158471 A | 9/1997 |
| CN | 101025438 A | 8/2007 |

(Continued)

OTHER PUBLICATIONS

Cooley, Portable Low-Cost Magnetic Resonance Imaging, Doctoral Dissertation, Massachusetts Institute of Technology, 2014 (Year: 2014).*

(Continued)

*Primary Examiner* — Daniel R Miller

(74) *Attorney, Agent, or Firm* — Foley & Lardner LLP

(57) ABSTRACT

An assembly for providing a $B_0$ magnetic field for a magnetic resonance imaging (MRI) system, the assembly comprising: a plurality of rods extending along a common longitudinal direction and positioned to form a bore extending along the common longitudinal direction, the plurality of rods including a first rod, the first rod comprising: ferromagnetic segments, each having a net magnetization in a plane that is substantially perpendicular to the common longitudinal direction; and non-ferromagnetic segments.

13 Claims, 24 Drawing Sheets

Related U.S. Application Data

(60) Provisional application No. 62/946,030, filed on Dec. 10, 2019.

(51) Int. Cl.
*G01R 33/385* (2006.01)
*G01R 33/44* (2006.01)

(56) References Cited

U.S. PATENT DOCUMENTS 5,194,810 A 3/1993 Breneman et al.
5,319,339 A 6/1994 Leupold
5,659,250 A 8/1997 Domigan et al.
5,886,070 A 3/1999 Honkura et al.
6,201,394 B1 3/2001 Danby et al.
6,340,888 B1 1/2002 Aoki et al.
6,621,267 B1 9/2003 Damadian et al.
6,657,433 B1 * 12/2003 Locatelli .............. G01R 33/383 324/318
6,970,061 B1 11/2005 Danby et al.
7,631,411 B2 12/2009 Mao et al.
D703,322 S 4/2014 Hayman et al.
D742,519 S 11/2015 Sul
9,224,526 B1 12/2015 Nagarathnam et al.
9,541,616 B2 1/2017 Rothberg et al.
9,547,057 B2 1/2017 Rearick et al.
9,625,543 B2 4/2017 Rearick et al.
9,625,544 B2 4/2017 Poole et al.
9,638,773 B2 5/2017 Poole et al.
9,645,210 B2 5/2017 Mcnulty et al.
D790,709 S 6/2017 Gmeiner et al.
9,797,971 B2 10/2017 Rearick et al.
9,817,093 B2 11/2017 Rothberg et al.
D806,660 S 1/2018 Braswell et al.
10,139,464 B2 11/2018 Rearick et al.
10,145,913 B2 12/2018 Hugon et al.
10,145,922 B2 12/2018 Rothberg et al.
10,222,434 B2 3/2019 Poole et al.
10,222,435 B2 3/2019 Mileski et al.
10,241,177 B2 3/2019 Poole et al.
10,274,561 B2 4/2019 Poole et al.
10,281,540 B2 5/2019 Mileski et al.
10,281,541 B2 5/2019 Poole et al.
10,295,628 B2 5/2019 Mileski et al.
10,310,037 B2 6/2019 Mcnulty et al.
10,324,147 B2 6/2019 Mcnulty et al.
10,330,755 B2 6/2019 Poole et al.
10,353,030 B2 7/2019 Poole et al.
10,371,773 B2 8/2019 Poole et al.
10,379,186 B2 8/2019 Rothberg et al.
10,416,264 B2 9/2019 Sofka et al.
10,444,310 B2 10/2019 Poole et al.
10,466,327 B2 11/2019 Rothberg et al.
10,488,482 B2 11/2019 Rearick et al.
10,495,712 B2 12/2019 Rothberg et al.
10,520,566 B2 12/2019 Poole et al.
10,527,692 B2 1/2020 Mcnulty et al.
10,534,058 B2 1/2020 Sofka et al.
10,539,637 B2 1/2020 Poole et al.
10,545,207 B2 1/2020 Poole et al.
D874,653 S 2/2020 Liu et al.
10,551,452 B2 2/2020 Rearick et al.
10,564,239 B2 2/2020 Poole et al.
10,591,561 B2 3/2020 Sacolick et al.
D889,467 S 7/2020 Fook
D890,927 S 7/2020 Chong
10,709,387 B2 7/2020 Poole et al.
10,867,733 B2 12/2020 Haham Hay
D912,822 S 3/2021 Hugon
D932,014 S 9/2021 Hugon
11,275,137 B2 3/2022 Hugon et al.
11,333,727 B2 5/2022 Hugon
11,422,213 B2 8/2022 Hugon et al.
2006/0232369 A1 10/2006 Gorshkov
2007/0146107 A1 6/2007 Lvovsky et al.
2009/0128272 A1 5/2009 Hills
2012/0013338 A1 1/2012 Sakellariou et al.
2013/0193973 A1 8/2013 Aubert
2014/0111202 A1 4/2014 Wald et al.
2014/0111205 A1 4/2014 Cazaux et al.
2015/0061680 A1 3/2015 Leskowitz
2015/0260809 A1 9/2015 Vidarsson
2016/0069968 A1 3/2016 Rothberg et al.
2016/0069970 A1 3/2016 Rearick et al.
2016/0069971 A1 3/2016 Mcnulty et al.
2016/0069972 A1 3/2016 Poole et al.
2016/0069975 A1 3/2016 Rothberg et al.
2016/0128592 A1 5/2016 Rosen et al.
2016/0131727 A1 5/2016 Sacolick et al.
2016/0169992 A1 6/2016 Rothberg et al.
2016/0169993 A1 6/2016 Rearick et al.
2016/0223631 A1 8/2016 Poole et al.
2016/0231399 A1 8/2016 Rothberg et al.
2016/0231402 A1 8/2016 Rothberg et al.
2016/0231403 A1 8/2016 Rothberg et al.
2016/0231404 A1 8/2016 Rothberg et al.
2016/0299203 A1 10/2016 Mileski et al.
2016/0299249 A1 10/2016 Ramirez et al.
2016/0334479 A1 11/2016 Poole et al.
2017/0032877 A1 2/2017 Inoue et al.
2017/0102443 A1 4/2017 Rearick et al.
2017/0227616 A1 8/2017 Poole et al.
2017/0254866 A1 9/2017 Haenichen et al.
2017/0276747 A1 9/2017 Hugon et al.
2017/0276749 A1 9/2017 Hugon et al.
2018/0024208 A1 1/2018 Rothberg et al.
2018/0038931 A1 2/2018 Rearick et al.
2018/0088193 A1 3/2018 Rearick et al.
2018/0143274 A1 5/2018 Poole et al.
2018/0143275 A1 5/2018 Sofka et al.
2018/0143280 A1 5/2018 Dyvorne et al.
2018/0143281 A1 5/2018 Sofka et al.
2018/0144467 A1 5/2018 Sofka et al.
2018/0156881 A1 6/2018 Poole et al.
2018/0164390 A1 6/2018 Poole et al.
2018/0168527 A1 6/2018 Poole et al.
2018/0210047 A1 7/2018 Poole et al.
2018/0224512 A1 8/2018 Poole et al.
2018/0226190 A1 8/2018 Meinke et al.
2018/0238978 A1 8/2018 Mcnulty et al.
2018/0238980 A1 8/2018 Poole et al.
2018/0238981 A1 8/2018 Poole et al.
2018/0313920 A1 * 11/2018 Sotgiu .................. G01R 33/383
2018/0325477 A1 * 11/2018 Wang ..................... A61B 6/032
2019/0004130 A1 1/2019 Poole et al.
2019/0011510 A1 1/2019 Hugon et al.
2019/0011513 A1 1/2019 Poole et al.
2019/0011514 A1 1/2019 Poole et al.
2019/0011521 A1 1/2019 Sofka et al.
2019/0018094 A1 1/2019 Mileski et al.
2019/0018095 A1 1/2019 Mileski et al.
2019/0018096 A1 1/2019 Poole et al.
2019/0025389 A1 1/2019 Mcnulty et al.
2019/0033402 A1 1/2019 Mcnulty et al.
2019/0033414 A1 1/2019 Sofka et al.
2019/0033415 A1 1/2019 Sofka et al.
2019/0033416 A1 1/2019 Rothberg et al.
2019/0038233 A1 2/2019 Poole et al.
2019/0086497 A1 3/2019 Rearick et al.
2019/0101607 A1 4/2019 Rothberg et al.
2019/0122818 A1 4/2019 Meinke et al.
2019/0162806 A1 5/2019 Poole et al.
2019/0178962 A1 6/2019 Poole et al.
2019/0178963 A1 6/2019 Poole et al.
2019/0227136 A1 7/2019 Mileski et al.
2019/0227137 A1 7/2019 Mileski et al.
2019/0250227 A1 8/2019 Mcnulty et al.
2019/0250228 A1 8/2019 Mcnulty et al.
2019/0257903 A1 8/2019 Poole et al.
2019/0324098 A1 10/2019 Mcnulty et al.
2019/0353720 A1 11/2019 Dyvorne et al.
2019/0353723 A1 11/2019 Dyvorne et al.
2019/0353726 A1 11/2019 Poole et al.
2019/0353727 A1 11/2019 Dyvorne et al.

(56) References Cited

U.S. PATENT DOCUMENTS

| | | | |
|---|---|---|---|
| 2020/0011952 | A1 | 1/2020 | Rothberg et al. |
| 2020/0018806 | A1 | 1/2020 | Rothberg et al. |
| 2020/0022611 | A1 | 1/2020 | Nelson et al. |
| 2020/0022612 | A1 | 1/2020 | Mcnulty et al. |
| 2020/0022613 | A1 | 1/2020 | Nelson et al. |
| 2020/0025846 | A1 | 1/2020 | Nelson et al. |
| 2020/0025851 | A1 | 1/2020 | Rearick et al. |
| 2020/0033431 | A1 | 1/2020 | Schlemper et al. |
| 2020/0034998 | A1 | 1/2020 | Schlemper et al. |
| 2020/0041588 | A1 | 2/2020 | O'Halloran et al. |
| 2020/0045112 | A1 | 2/2020 | Sacolick et al. |
| 2020/0054241 | A1 | 2/2020 | Nelson et al. |
| 2020/0058106 | A1 | 2/2020 | Lazarus et al. |
| 2020/0064427 | A1 | 2/2020 | Poole et al. |
| 2020/0200844 | A1 | 6/2020 | Boskamp et al. |
| 2020/0209334 | A1 | 7/2020 | O'Halloran et al. |
| 2020/0237310 | A1 | 7/2020 | Lozano-Buhl et al. |
| 2020/0289019 | A1 | 9/2020 | Schlemper et al. |
| 2020/0289022 | A1 | 9/2020 | Coumans et al. |
| 2020/0294229 | A1 | 9/2020 | Schlemper et al. |
| 2020/0294282 | A1 | 9/2020 | Schlemper et al. |
| 2020/0294287 | A1 | 9/2020 | Schlemper et al. |
| 2020/0337587 | A1 | 10/2020 | Sacolick et al. |
| 2020/0355765 | A1 | 11/2020 | Chen et al. |
| 2021/0173024 | A1 | 6/2021 | Hugon |
| 2021/0173025 | A1 | 6/2021 | Hugon |
| 2021/0173026 | A1 | 6/2021 | Hugon et al. |
| 2021/0173027 | A1 | 6/2021 | Hugon et al. |
| 2021/0173029 | A1 | 6/2021 | Hugon |
| 2022/0082643 | A1 | 3/2022 | Poole et al. |
| 2022/0354378 | A1 | 11/2022 | Nacev et al. |
| 2024/0168105 | A1 | 5/2024 | Inglis et al. |

FOREIGN PATENT DOCUMENTS

| | | | |
|---|---|---|---|
| CN | 103703536 | A | 4/2014 |
| CN | 104507386 | A | 4/2015 |
| CN | 107110932 | A | 8/2017 |
| CN | 108139453 | A | 6/2018 |
| EP | 0 479 278 | A1 | 4/1992 |
| EP | 0 801 314 | A1 | 10/1997 |
| EP | 1 004 888 | A1 | 5/2000 |
| EP | 1 069 575 | A1 | 1/2001 |
| JP | S63-143045 | A | 6/1988 |
| JP | H04-082536 | A | 3/1992 |
| JP | 2003-153873 | A | 5/2003 |
| WO | WO-2013/187924 | A1 | 12/2013 |
| WO | WO-2017/072805 | A1 | 5/2017 |
| WO | WO-2017/134635 | A1 | 8/2017 |
| WO | WO-2020/050776 | A1 | 3/2020 |
| WO | WO-2020/109895 | A1 | 6/2020 |

OTHER PUBLICATIONS

Z. H. Ren, W. C. Mu and S. Y. Huang, "Design and Optimization of a Ring-Pair Permanent Magnet Array for Head Imaging in a Low-Field Portable MRI System," in IEEE Transactions on Magnetics, vol. 55, No. 1, pp. 1-8, Jan. 2019 (Year: 2019).*

U.S. Appl. No. 17/116,540, filed Dec. 9, 2020, Hugon, et al.

U.S. Appl. No. 29/716,476, filed Dec. 10, 2019, Cedric Hugon.

U.S. Appl. No. 29/716,483, filed Dec. 10, 2019, Cedric Hugon.

Chandrana et al., Automatic alignment of multiple magnets into Halbach cylinders, Journal of Magnetism and Magnetic Materials 381, pp. 396-400, 2015 (Year: 2015).

Cooley et al., Design of sparse Halbach magnet arrays for portable MRI using a genetic algorithm. IEEE transactions on magnetics. Jan. 1, 2018;54(1):1-12.

Cooley et al., Two-dimensional imaging in a lightweight portable MRI scanner without gradient coils. Magnetic Resonance in Medicine. 2014. 12 pages.

Halbach, Design of permanent multi pole magnets with oriented rare earth cobalt material, Nuclear instruments and methods. Feb. 1, 1980; 169(1 ): 1-0.

Huang et al., Portable Low-cost MRI System based on Permanent Magnets/Magnet Arrays.arXiv preprint arXiv:1812.10474. Dec. 24, 2018. 30 pages.

International Preliminary Report on Patentability for International Application No. PCT/US2020/063906 mailed Jun. 23, 2022.

International Preliminary Report on Patentability for International Application No. PCT/US2020/063933 mailed Jun. 23, 2022.

International Preliminary Report on Patentability for International Application No. PCT/US2020/063980 mailed Jun. 23, 2022.

International Search Report and Written Opinion for International Application No. PCT/US2020/063906 mailed May 11, 2021.

International Search Report and Written Opinion for International Application No. PCT/US2020/063933 mailed May 25, 2021.

International Search Report and Written Opinion for International Application No. PCT/US2020/063980 mailed Jun. 16, 2021.

Invitation to Pay Additional Fees for International Application No. PCT/US2020/063906 mailed Mar. 18, 2021.

Invitation to Pay Additional Fees for International Application No. PCT/US2020/063933 mailed Apr. 1, 2021.

Invitation to Pay Additional Fees for International Application No. PCT/US2020/063980 mailed Apr. 22, 2021.

Moresi et al., Miniature permanent magnet for table-top NMR. Concepts in Magnetic Resonance Part B: Magnetic Resonance Engineering: An Educational Journal. 2003;19(1):35-43.

Raich et al., Design and construction of a dipolar Halbach array with a homogeneous field from identical bar magnets: NMR Mandhalas. Concepts in Magnetic Resonance Part B: Magnetic Resonance Engineering: An Educational Journal. Oct. 2004;23(1): 16-25.

Ren et al., Design and optimization of a ring-pair permanent magnet array for head imaging in a low-field portable MRI system. IEEE Transactions on Magnetics. Nov. 12, 2018;55(1 ): 1-8.

Ren et al., Magnet array for a portable magnetic resonance imaging system. 2015 IEEE MTT-S 2015 International Microwave Workshop Series on RF and Wireless Technologies for Biomedical and Healthcare Applications (IMWS-BIO) Sep. 21, 2015:92-95.

Soltner et al., Dipolar Halbach magnet stacks made from identically shaped permanent magnets for magnetic resonance. Concepts in magnetic resonance part a. Jul. 2010;36(4):21 I-22.

Zhang et al., Design, construction and NMR testing of a 1 tesla Halbach Permanent Magnet for Magnetic Resonance. COMSOL Users Conference, Boston. 2005. 5 pages.

Zhu et al., Halbach permanent magnet machines and applications: a review. IEE Proceedings—Electric Power Applications. Jul. 6, 2001;148(4):299-308.

CN Search Report on CN App. No. 202080096113.X Dtd Mar. 31, 2025.

CN Search Report on CN App. No. 202080096140.7 Dtd Mar. 27, 2025.

* cited by examiner

PERMANENT MAGNET ASSEMBLY FOR MAGNETIC RESONANCE IMAGING WITH NON-FERROMAGNETIC FRAME

CROSS REFERENCE TO RELATED APPLICATIONS

This application claims priority under 35 U.S.C. § 120 and is a continuation of U.S. patent application Ser. No. 17/116,540 (now 11,656,308) filed on Dec. 9, 2020, which claims priority under 35 U.S.C. § 119 (e) to U.S. Provisional Patent Application Ser. No. 62/946,030, titled "PERMANENT MAGNET ASSEMBLY FOR MAGNETIC RESONANCE IMAGING WITH NON-FERROMAGNETIC FRAME," filed on Dec. 10, 2019, each of which is incorporated by reference in its entirety herein.

BACKGROUND

Magnetic resonance imaging (MRI) provides an important imaging modality for numerous applications and is widely utilized in clinical and research settings to produce images of the inside of the human body. As a generality, MRI is based on detecting magnetic resonance (MR) signals, which are electromagnetic waves emitted by atoms in response to state changes resulting from applied electromagnetic fields. For example, nuclear magnetic resonance (NMR) techniques involve detecting MR signals emitted from the nuclei of excited atoms upon the re-alignment or relaxation of the nuclear spin of atoms in an object being imaged (e.g., atoms in the tissue of the human body). Detected MR signals may be processed to produce images, which in the context of medical applications, allows for the investigation of internal structures and/or biological processes within the body for diagnostic, therapeutic and/or research purposes.

SUMMARY

Some embodiments are directed to an assembly for providing a $B_0$ magnetic field for a magnetic resonance imaging (MRI) system. The assembly comprises: a plurality of rods extending along a common longitudinal direction and positioned to form a bore extending along the common longitudinal direction, the plurality of rods including a first rod. The first rod comprises: ferromagnetic segments, each having a net magnetization in a plane that is substantially perpendicular to the common longitudinal direction; and non-ferromagnetic segments.

Some embodiments are directed to a method of manufacturing an assembly for providing a $B_0$ magnetic field for an MRI system. The method comprises: accessing information specifying segment layouts for each of a plurality of rods including a first layout for a first rod in the plurality of rods, the first layout indicating positions for ferromagnetic segments and non-ferromagnetic segments in the first rod and net magnetization orientations for at least some of the ferromagnetic segments; obtaining ferromagnetic segments and non-ferromagnetic segments; assembling the plurality of rods from the ferromagnetic segments and the non-ferromagnetic segments in accordance with the information specifying segment layouts, the assembling comprising: assembling the first rod, using at least some of the ferromagnetic segments and at least some of the non-ferromagnetic segments, in accordance with the first layout by orienting at least some of the ferromagnetic segments in accordance with the net magnetization orientations; and assembling the plurality of rods into an arrangement in which the plurality of extend along a common longitudinal direction and form a bore extending along the common longitudinal direction.

Some embodiments are directed to an assembly for providing a $B_0$ magnetic field for an MRI system. The assembly comprises: a non-ferromagnetic frame forming a bore extending along a common longitudinal direction; and a plurality of ferromagnetic segments housed within the non-ferromagnetic frame, wherein at least some of the plurality of ferromagnetic segments have a net magnetization in a plane that is substantially perpendicular to the common longitudinal direction.

Some embodiments are directed to an assembly for providing a $B_0$ magnetic field for an MRI system. The assembly comprises a plurality of ferromagnetic segments positioned to form: a bore extending along a common longitudinal direction, and a first gap, on a first side of the bore, to accommodate at least one first gradient coil, wherein at least some of the plurality of ferromagnetic segments are positioned on one side of the first gap and at least some others of the plurality of ferromagnetic segments are positioned on another side of the first gap.

Some embodiments are directed to an assembly for providing a $B_0$ magnetic field for an MRI system. The assembly comprises: a plurality of ferromagnetic segments positioned to form a bore extending along a common longitudinal direction; and a first gradient coil positioned on a first side of the bore, wherein at least some of the plurality of ferromagnetic segments are positioned on one side of the first gradient coil and at least some others of the plurality of ferromagnetic segments are positioned on another side of the first gradient coil.

BRIEF DESCRIPTION OF DRAWINGS

Various aspects and embodiments will be described with reference to the following figures. It should be appreciated that the figures are not necessarily drawn to scale. In the drawings, each identical or nearly identical component that is illustrated in various figures is represented by a like numeral. For purposes of clarity, not every component may be labeled in every drawing.

DETAILED DESCRIPTION

Figure 1:
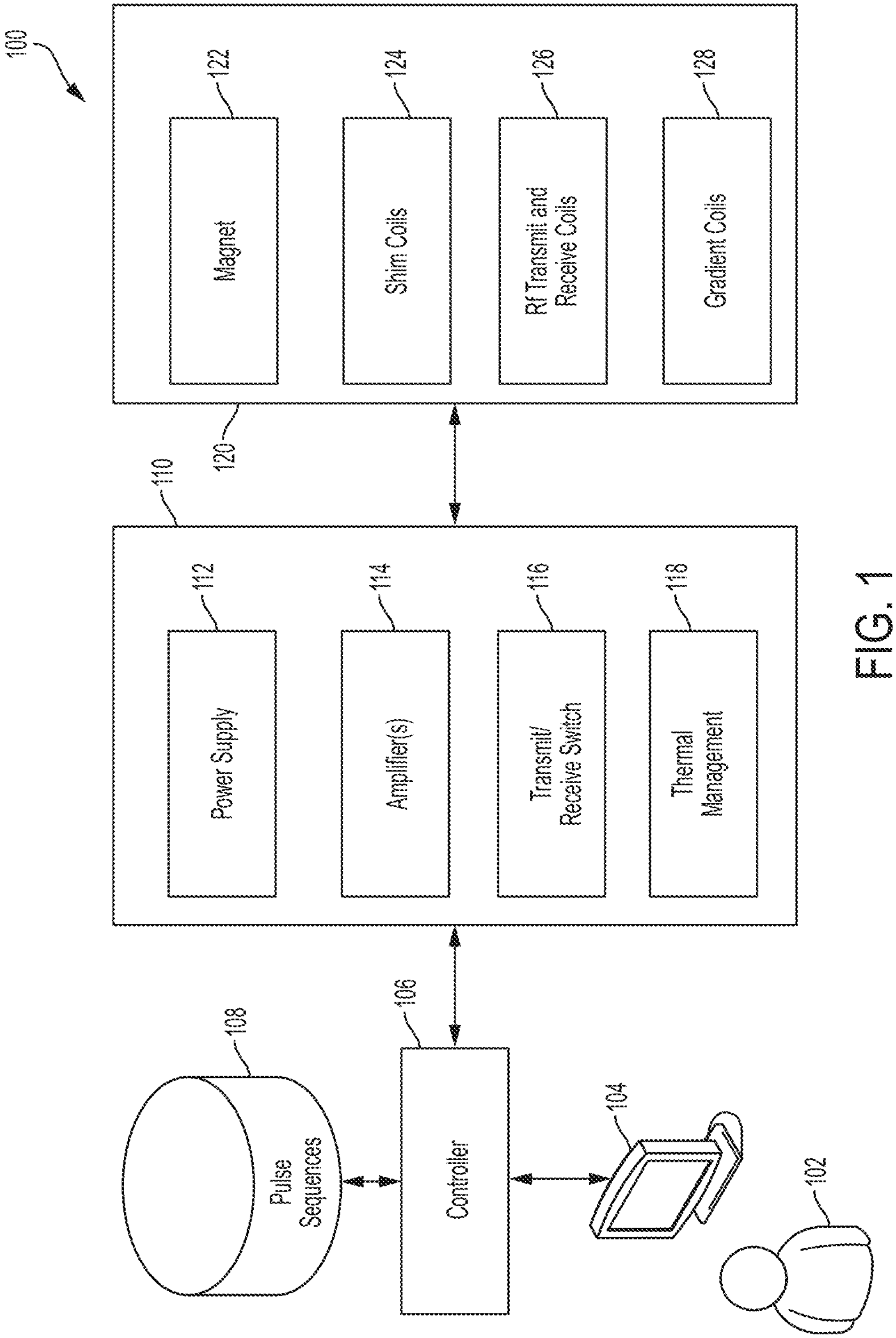
FIG. 1 illustrates exemplary components of a magnetic resonance imaging (MRI) system, in accordance with some embodiments of the technology described herein.

Conventional magnetic resonance imaging (MRI) systems are overwhelmingly high-field systems, particularly for medical or clinical MRI applications. The general trend in medical imaging has been to produce MRI scanners with increasingly greater field strengths, with the vast majority of clinical MRI scanners operating at 1.5 T or 3 T, with higher field strengths of 7 T and 9 T used in research settings. As used herein, "high-field" refers generally to MRI systems presently in use in a clinical setting and, more particularly, to MRI systems operating with a main magnetic field (i.e., a $B_0$ field) at or above 1.5 T, though clinical systems operating between 0.5 T and 1.5 T are often also characterized as "high-field." By contrast, "low-field" refers generally to MRI systems operating with a $B_0$ field of less than or equal to approximately 0.2 T, though systems having a $B_0$ field of between 0.2 T and approximately 0.3 T have sometimes been characterized as low-field as a consequence of increased field strengths at the high end of the high-field regime.

Some conventional low-field MRI systems may produce the main magnetic $B_0$ field using a magnet assembly having a steel frame and permanent magnets attached to the steel frame. However, a main magnetic field may be produced without a steel frame, using an assembly of permanent magnets constructed without a ferromagnetic (e.g., steel) frame. Such permanent magnet assemblies may be constructed with a non-ferromagnetic frame and generally allow a similar field strength, performance, and accessibility for a lighter total weight as assemblies with a ferromagnetic frame. However, the total weight and cost of the permanent magnets in an assembly with a non-ferromagnetic frame can be twice as much as the amount of a permanent magnet used in a comparable assembly with a ferromagnetic frame. The use of assemblies with a non-ferromagnetic frame may thus be advantageous when the assembly of magnets fits tightly around a region of interest (e.g., the imaging region in an MRI scanner) and/or when a great value is placed on the total weight of the system (e.g., to increase portability).

A permanent magnet assembly with a non-ferromagnetic frame may be realized using a Halbach dipole array, in which the permanent magnets form a cylindrical structure in which the magnetization rotates twice as fast as the position rotates around the cylinder. In the ideal two-dimensional case, the cylinder is infinitely long and the magnetization rotates continuously around the cylinder, creating a uniform field within its cavity and generating zero field outside the cylinder. The uniform field is oriented in a plane orthogonal to the longitudinal axis of the cylinder. Although these characteristics are highly desirable, they are difficult to achieve in practice. Indeed, in practice, the cylinder has finite length and a continuous variation of magnetization orientation around the cylinder is difficult to achieve in manufacturing. Rather, conventional Halbach arrays are manufactured by: (1) discretizing the cylinder in the azimuthal direction and/or along the axis of the cylinder into multiple blocks, each of which is easier to manufacture; and (2) assembling the Halbach array out of the multiple blocks. However, such discretization and finite length of the resulting arrays affect field homogeneity and/or efficiency.

The inventors have developed new types of permanent magnet assemblies with a non-ferromagnetic frame, which improve upon Halbach arrays by increasing homogeneity of the generated magnetic field and reducing manufacturing complexity. In particular, the inventors have recognized that permanent magnet assemblies with a non-ferromagnetic frame may be formed with identically-shaped permanent magnet segments stacked in an array together with one or more non-magnetic segments, with each of the permanent magnet segments having a tailored magnetic orientation depending on their position along the length and the azimuth of the array. The magnetic orientation of the segments in the assemblies with a non-ferromagnetic frame developed by the inventors is different from the conventional, continuously-rotating Halbach dipole configuration and is not constrained to the angularly varying magnetization of a Halbach dipole configuration (e.g., in which the magnetization rotates twice as fast as the position rotates around the cylinder) to achieve magnetic field homogeneity.

The inventors have also recognized including an orientation feature in the permanent magnet segments to ease manufacturing complexity and cost of the magnetic assembly. The orientation feature (e.g., a flat surface, a notch, and/or a dimple) on a permanent magnet segment may be aligned with the magnetic orientation of the segment so that the manufacturer assembling such segments into an assembly may know the magnetic orientation of each permanent magnet segment precisely. Including such an orientation feature may also allow a manufacturer to precisely rotate the permanent magnet segments to provide a wide range of potential magnetic orientations of the segments within the assembly.

The inventors have further recognized that a permanent magnet assembly with a non-ferromagnetic frame may include cut-outs or other similar features configured to accommodate a patient during imaging (e.g., to accommodate a patient's shoulders when imaging the patient's head in the imaging region). Including such features may functionally increase the array's aspect ratio while reducing the total weight of the magnetic material used, thereby increasing field homogeneity and/or strength, reducing cost of materials, and still allowing a patient to comfortably be positioned within the imaging region of an MRI system that uses such an assembly to generate the main magnetic field.

The inventors have developed systems and methods of assembling and designing permanent magnet assemblies with a non-ferromagnetic frame for providing a $B_0$ magnetic field for an MRI system. In some embodiments, the magnet assembly includes rods that extending along a common longitudinal direction. The rods may be positioned to form a bore (e.g., a cylindrical bore, a rectangular bore, or a bore of any other suitable shape) extending along the common longitudinal direction. In some embodiments, the rods may include a first rod. The first rod may include ferromagnetic segments that have a net magnetization that lies in a plane that is substantially perpendicular to the common longitudinal direction.

In some embodiments, the first rod may also include non-ferromagnetic segments. The non-ferromagnetic segments and the ferromagnetic segments may be interspersed within the first rod. For example, one or more ferromagnetic segments may be followed by one or more non-ferromagnetic segments along the length of the rod. Additionally or alternatively, in some embodiments one or more ferromagnetic segments may be positioned between at least two non-ferromagnetic segments (e.g., at least one non-ferromagnetic segment may be positioned on either side of the one or more ferromagnetic segments). As another example, one or more ferromagnetic segments may be followed by one or more non-ferromagnetic segments that, in turn, may be followed by one or more ferromagnetic segments that, in turn, may be followed by one or more non-ferromagnetic segments, and so on.

In some embodiments, the first rod may include a sub-rod, the sub-rod consisting of one or more of the non-ferromagnetic segments. Each end of the sub-rod may be adjacent to one of the ferromagnetic segments.

In some embodiments, the rods may be positioned to provide a substantially homogenous magnetic field within an imaging region within the bore.

In some embodiments, the ferromagnetic segments may be all substantially a same size and shape. In some embodiments, one or more non-ferromagnetic segments may be substantially a same size and shape as one of the ferromagnetic segments.

Ferromagnetic segments may have any suitable shape. For example, in some embodiments, a ferromagnetic segment may be shaped as a cylinder. In other embodiments, a ferromagnetic segment may be shaped as a truncated cylinder. The truncated cylinder may have two flat surfaces opposing each other along the common longitudinal direction. The truncated cylinder may also have a third flat surface extending from the first flat surface to the second flat surface along the common longitudinal direction. In some embodiments, the net magnetization of the ferromagnetic segment may be oriented in a direction that is substantially perpendicular to the common longitudinal direction. Additionally, the net magnetization of the ferromagnetic segment may be oriented at a specified angle relative to the third flat surface of the ferromagnetic segment.

In some embodiments, all of the rods may have the same length. In other embodiments, at least two of the rods may have different lengths. For example, in some embodiments, the rods may have different lengths and be positioned to accommodate insertion of a patient's shoulders within a perimeter of the bore.

In some embodiments, the rods may be positioned in a single layer around the bore. In other embodiments, the rods may be positioned in multiple concentric layers around the bore.

In some embodiments, the bore may have a length that is substantially equal to a width of the bore (e.g., a 1:1 aspect ratio). In other embodiments, the bore may have a length that is substantially equal to twice the width of the bore (e.g., a 1:2 aspect ratio).

In some embodiments, the magnetic assembly may weigh less than 120 kg. In other embodiments, the magnetic assembly may weigh less than 70 kg or even less than 50 kg.

In some embodiments, the rods may be at least partially cylindrical rods.

The inventors have also developed an MRI system having a permanent magnet assembly to provide the $B_0$ magnetic field for the MRI system. In some embodiments, the MRI system may include a magnetic assembly as discussed herein as well as gradient coils configured to generate magnetic field to provide spatial encoding of emitted magnetic resonance signals. Additionally, the MRI system may include a radio frequency (RF) transmit coil and a power system configured to provide power to the gradient coils and the RF transmit coil. In some embodiments, the gradient coils may be positioned inside the bore formed by the rods. In other embodiments, the gradient coils may be positioned outside the bore formed by the rods. In some embodiments, the MRI system may be used to capture at least one magnetic resonance (MR) image.

The inventors have further developed an assembly for providing a $B_0$ magnetic field for a magnetic resonance imaging (MRI) system including a non-ferromagnetic frame. The assembly may include at least partially cylindrical ferromagnetic segments housed within the non-ferromagnetic frame. In some embodiments, the non-ferromagnetic frame may form a bore extending along a common longitudinal direction, and the at least partially cylindrical ferromagnetic segments may have a net magnetization which is oriented in a plane that is substantially perpendicular to the common longitudinal direction.

In some embodiments, the non-ferromagnetic frame may be formed of non-ferromagnetic sheets (e.g., plastic sheets and/or fiberglass sheets). The non-ferromagnetic sheets may include slots configured to house the at least partially cylindrical ferromagnetic segments. In some embodiments, the at least partially cylindrical ferromagnetic segments may be positioned within the plurality of non-ferromagnetic sheets in rows that extend along the common longitudinal direction. The rows may include regions containing the non-ferromagnetic sheets.

In some embodiments, the at least partially cylindrical ferromagnetic segments may include two groups of segments. The first group of at least partially cylindrical ferromagnetic segments may have a first diameter, and the second group of at least partially cylindrical ferromagnetic segments may have a second diameter which is different than the first diameter.

In some embodiments, the at least partially cylindrical ferromagnetic segments may be shaped as a truncated cylinder having a first flat surface and a second flat surface opposing the first flat surface along the common longitudinal direction. The segments may have a third flat surface extending from the first flat surface to the second flat surface along the common longitudinal direction. In some embodiments, a net magnetization of the ferromagnetic segments may be oriented in a direction substantially perpendicular to the common longitudinal direction at a specified angle to the third flat surface.

The inventors have further developed an improved method of manufacturing a magnetic assembly for providing a $B_0$ magnetic field for an MRI system. In some embodiments, the method may include accessing information that specifies segment layouts for rods. The segment layouts may include a first layout for a first rod and the first layout may indicate positions for ferromagnetic segments and non-ferromagnetic segments in the first rod. The first layout may also specify net magnetization orientations for at least some of the ferromagnetic segments in the first rod.

In some embodiments, the method may also include obtaining ferromagnetic segments and non-ferromagnetic segments. The obtained segments may be assembled into the rods in accordance with the information specifying the segment layouts. In some embodiments, assembling the rods may include assembling the first rod using at least some of the ferromagnetic segments and at least some of the non-ferromagnetic segments in accordance with the first layout. The ferromagnetic segments may also be oriented in accordance with the net magnetization orientations of the segment layouts. Additionally, assembling the rods may include assembling the rods into an arrangement in which the rods extend along a common longitudinal direction. The positioned rods may form a bore extending along the common longitudinal direction.

In some embodiments, assembling the first rod may also include orienting at least some of the ferromagnetic segments in accordance with a net magnetization oriented in a plane that is substantially perpendicular to the common longitudinal direction. The orienting may be performed by orienting the ferromagnetic segments in a direction based on a physical characteristic (e.g., a flat, a notch, and/or a dimple) of the ferromagnetic segments. In some embodiments, the ferromagnetic segments may be shaped as a truncated cylinder. The truncated cylinder may include a first flat surface, a second flat surface, and a third flat surface extending from the first flat surface to the second flat surface. The magnetic orientation of the ferromagnetic segments may be aligned at an angle relative to the third flat surface of the truncated cylinder.

In some embodiments, assembling the first rod may include assembling a sub-rod including non-ferromagnetic segments. The sub-rod may be assembled in the first rod with each end adjacent to a ferromagnetic segment. Alternatively, the ferromagnetic segments may be interspersed with the non-ferromagnetic segments within the first rod.

In some embodiments, the method may include determining the segment layouts for each of the rods. The segment layouts may be determined using cone programming, and positions may be determined for ferromagnetic segments and non-ferromagnetic segments within the segment layouts. Additionally, orientations of the net magnetizations of the ferromagnetic segments may be determined.

Alternatively and/or additionally, in some embodiments the segment layouts may be determined using integer programming. Positions may be determined for ferromagnetic segments and non-ferromagnetic segments within the segment layouts and orientations of the net magnetizations of the ferromagnetic segments may be determined. The value of the net magnetizations of the ferromagnetic segments may be constrained to certain values by the integer programming (e.g., using conic constraints, in some embodiments). In some embodiments, determining the orientation of the net magnetization of the ferromagnetic segments may include determining that the net magnetization orientation of each segment location lies within a plane perpendicular to the common longitudinal direction.

In some embodiments, the ferromagnetic segments may be manufactured using one or more methods. One method may include placing a magnetic metal alloy powder and/or a bonding agent into a tube with a cross sectional area of a desired shape. The method may include applying a magnetic field to the magnetic metal alloy powder while compressing the magnetic metal alloy powder and the tube to align particles of the magnetic metal alloy powder. In embodiments where no bonding agent is added to the tube, the magnetic metal alloy powder may be sintered to obtain a solid magnetic metal alloy component. In other embodiments, the solid magnetic metal alloy may be formed through compression and/or the properties of the bonding agent, and no sintering may be performed. The solid magnetic metal alloy may be magnetized and segmented to form the ferromagnetic segments.

Following below are more detailed descriptions of various concepts related to, and embodiments of, magnet assemblies built without using a ferromagnetic frame. It should be appreciated that various aspects described herein may be implemented in any of numerous ways. Examples of specific implementations are provided herein for illustrative purposes only. In addition, the various aspects described in the embodiments below may be used alone or in any combination, and are not limited to the combinations explicitly described herein.

FIG. 1 is a block diagram of components of a MRI system 100. In the illustrative example of FIG. 1, MRI system 100 comprises computing device 104, controller 106, pulse sequences store 108, power management system 110, and magnetics components 120. It should be appreciated that system 100 is illustrative and that an MRI system may have one or more other components of any suitable type in addition to or instead of the components illustrated in FIG. 1. However, an MRI system will generally include these high level components, though the implementation of these components for a particular MRI system may differ.

As illustrated in FIG. 1, magnetics components 120 comprise $B_0$ magnet 122, shim coils 124, RF transmit and receive coils 126, and gradient coils 128. Magnet 122 may be used to generate the main magnetic field $B_0$. Magnet 122 may be any suitable type or combination of magnetics components that can generate a desired main magnetic $B_0$ field. In some embodiments, magnet 122 may be a permanent magnet, an electromagnet, a superconducting magnet, or a hybrid magnet comprising one or more permanent magnets and one or more electromagnets and/or one or more superconducting magnets. In some embodiments, magnet 122 may be a permanent magnet having a non-ferromagnetic frame.

Gradient coils 128 may be positioned to provide gradient fields and, for example, may be positioned to generate gradients in the $B_0$ field in three substantially orthogonal directions (X, Y, and Z). Gradient coils 128 may be configured to encode emitted MR signals by systematically varying the $B_0$ field (the $B_0$ field generated by magnet 122 and/or shim coils 124) to encode the spatial location of received MR signals as a function of frequency or phase. For example, gradient coils 128 may be configured to vary frequency or phase as a linear function of spatial location along a particular direction, although more complex spatial encoding profiles may also be provided by using nonlinear gradient coils.

In some embodiments, some or all of the gradient coils 128 may be formed as a portion of a laminate panel. The laminate panel may comprise at least one conductive layer patterned on at least one non-conductive layer to form one or more gradient coils, or a portion of one or more gradient coils, capable of producing or contributing to magnetic fields suitable for providing spatial encoding of detected MR signals. For example, the laminate panel may comprise a plurality of laminate layers (e.g., non-conductive and conductive layers) on which gradient coils are formed. In some embodiments, the conductive layers may be patterned to form one or more X-gradient coils (or portions thereof), one or more Y-gradient coils (or portions thereof) and/or one or more Z-gradient coils (or portions thereof).

As one non-limiting example wherein gradient coils are at least partially formed in a laminate panel, a Z-gradient coil may be formed, at least in part, in one or more layers using a generally circular geometry and an X-gradient coil and a Y-gradient coil may be formed, at least in part, in one or more layers using a generally rectangular geometry such as via one or more conductors patterned as a grid. The conductors for the gradient coils may be distributed across one or multiple layers in any combination as desired to produce integrated gradient coils, either with or without other magnetic components of a low field MRI system, and either sharing layers with other magnetic components and/or patterned on separate layers of a laminate panel. Additional magnetics components (e.g., $B_0$ coils, shim coils, and/or transmit/receive coils) may be patterned on additional layers of the laminate panel, or on separate laminate panels, in some embodiments. Aspects of forming gradient coils 128 using one or more laminate panels are described in U.S. Pat. No. 9,817,093, filed on Sep. 4, 2015, and titled “Low Field Magnetic Resonance Imaging Methods and Apparatus,” which is incorporated herein by reference in its entirety.

MRI is performed by exciting and detecting emitted MR signals using transmit and receive coils, respectively (often referred to as radio frequency (RF) coils). Transmit/receive coils may include separate coils for transmitting and receiving, multiple coils for transmitting and/or receiving, or the same coils for transmitting and receiving. Thus, a transmit/receive component may include one or more coils for transmitting, one or more coils for receiving and/or one or more coils for transmitting and receiving. Transmit/receive coils are also often referred to as Tx/Rx or Tx/Rx coils to generically refer to the various configurations for the transmit and receive magnetics component of an MRI system. These terms are used interchangeably herein. In FIG. 1, RF transmit and receive coils 126 comprise one or more transmit coils that may be used to generate RF pulses to induce an oscillating magnetic field $B_1$. The transmit coil(s) may be configured to generate any suitable types of RF pulses.

Power management system 110 includes electronics to provide operating power to one or more components of the low-field MRI system 100. For example, power management system 110 may include one or more power supplies, gradient power components, transmit coil components, and/or any other suitable power electronics needed to provide suitable operating power to energize and operate components of MRI system 100. As illustrated in FIG. 1, power management system 110 comprises power supply 112, power component(s) 114, transmit/receive switch 116, and thermal management components 118 (e.g., cryogenic cooling equipment for superconducting magnets). Power supply 112 includes electronics to provide operating power to magnetic components 120 of the MRI system 100. For example, power supply 112 may include electronics to provide operating power to one or more $B_0$ coils (e.g., $B_0$ magnet 122) to produce the main magnetic field for the low-field MRI system. Transmit/receive switch 116 may be used to select whether RF transmit coils or RF receive coils are being operated.

Power component(s) 114 may include one or more RF receive (Rx) pre-amplifiers that amplify MR signals detected by one or more RF receive coils (e.g., coils 126), one or more RF transmit (Tx) power components configured to provide power to one or more RF transmit coils (e.g., coils 126), one or more gradient power components configured to provide power to one or more gradient coils (e.g., gradient coils 128), and one or more shim power components configured to provide power to one or more shim coils (e.g., shim coils 124).

As illustrated in FIG. 1, MRI system 100 includes controller 106 (also referred to as a console) having control electronics to send instructions to and receive information from power management system 110. Controller 106 may be configured to implement one or more pulse sequences, which are used to determine the instructions sent to power management system 110 to operate the magnetic components 120 in a desired sequence (e.g., parameters for operating the RF transmit and receive coils 126, parameters for operating gradient coils 128, etc.). As illustrated in FIG. 1, controller 106 also interacts with computing device 104 programmed to process received MR data. For example, computing device 104 may process received MR data to generate one or more MR images using any suitable image reconstruction process(es). Controller 106 may provide information about one or more pulse sequences to computing device 104 for the processing of data by the computing device. For example, controller 106 may provide information about one or more pulse sequences to computing device 104 and the computing device may perform an image reconstruction process based, at least in part, on the provided information.

Figure 2A:
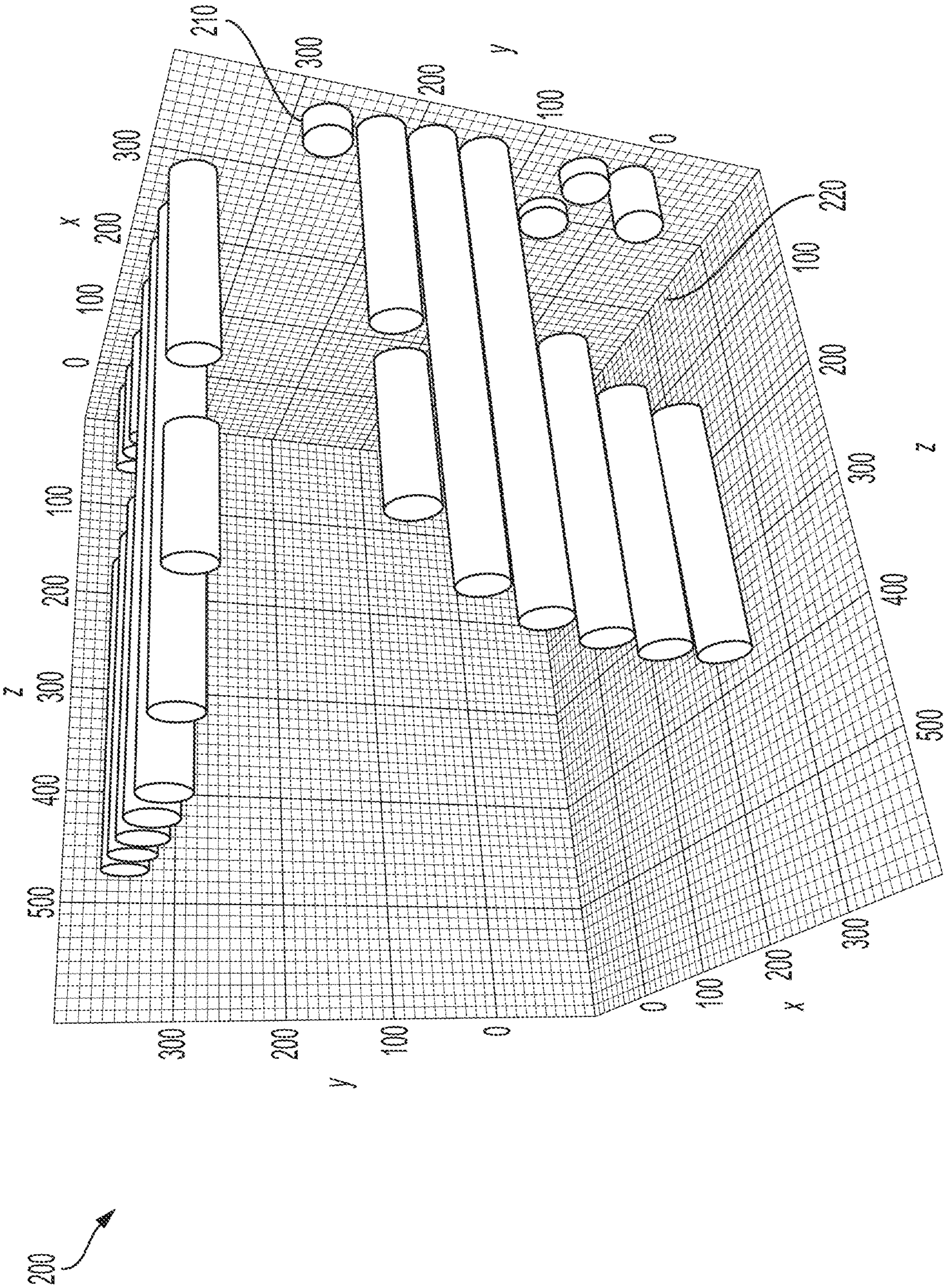
FIG. 2A illustrates an embodiment of a rectangular magnetic assembly for providing a $B_0$ magnetic field for an MRI system, in accordance with some embodiments of the technology described herein.

FIG. 2A depicts a portion of a rectangular magnetic assembly 200 for providing a $B_0$ magnetic field for an MRI system, in accordance with some embodiments of the technology described herein. The arrangement of ferromagnetic segments 210 and non-ferromagnetic segments 220 (not pictured) of the rectangular magnetic assembly 200 is depicted in FIG. 2A for one-eighth of the total assembly. The portion of the rectangular magnetic assembly 200 depicted in FIG. 2A may be suitably mirrored (e.g., across the x-, y-, and z-planes) to form a magnetic assembly having a rectangular bore along a common longitudinal direction.

In some embodiments, the ferromagnetic segments 210 may be formed of permanent magnet material. A permanent magnet refers to any object or material that maintains its own persistent magnetic field once magnetized. Materials that can be magnetized to produce a permanent magnet are referred to herein as ferromagnetic and include, as non-limiting examples, iron, nickel, cobalt, neodymium (NdFeB) alloys, samarium cobalt (SmCo) alloys, alnico (AlNiCo) alloys, strontium ferrite, barium ferrite, etc. Permanent magnet material may also maintain its own internal net magnetization orientation once magnetized.

Ferromagnetic segments 210 may be manufactured using conventional methods of manufacturing permanent magnet materials. Alternatively or additionally, ferromagnetic segments 210 may be manufactured using swaging methods as described in U.S. Patent Application Publication No.: 2019/0122818, filed Sep. 28, 2018 and titled "Method of Manufacturing Permanent Magnets," which is incorporated by reference herein in its entirety.

The permanent magnet material used may be selected depending on the design requirements of the magnetic assembly. For example, according to some embodiments, the ferromagnetic segments 210 (or some portion thereof) may be made of NdFeB, which produces a magnetic field with a relatively high magnetic field per unit volume of material once magnetized. According to some embodiments, SmCo material is used to form the ferromagnetic segments, or some portion thereof. While NdFeB produces higher field strengths (and in general is less expensive than SmCo), SmCo exhibits less thermal drift and thus provides a more stable magnetic field in the face of temperature fluctuations. Other types of permanent magnet material(s) may be used as well, as the aspects are not limited in this respect. In general, the type or types of permanent magnet material utilized will depend, at least in part, on the field strength, temperature stability, field homogeneity, weight, cost and/or ease of use requirements of a given magnet assembly implementation.

Figure 5A:
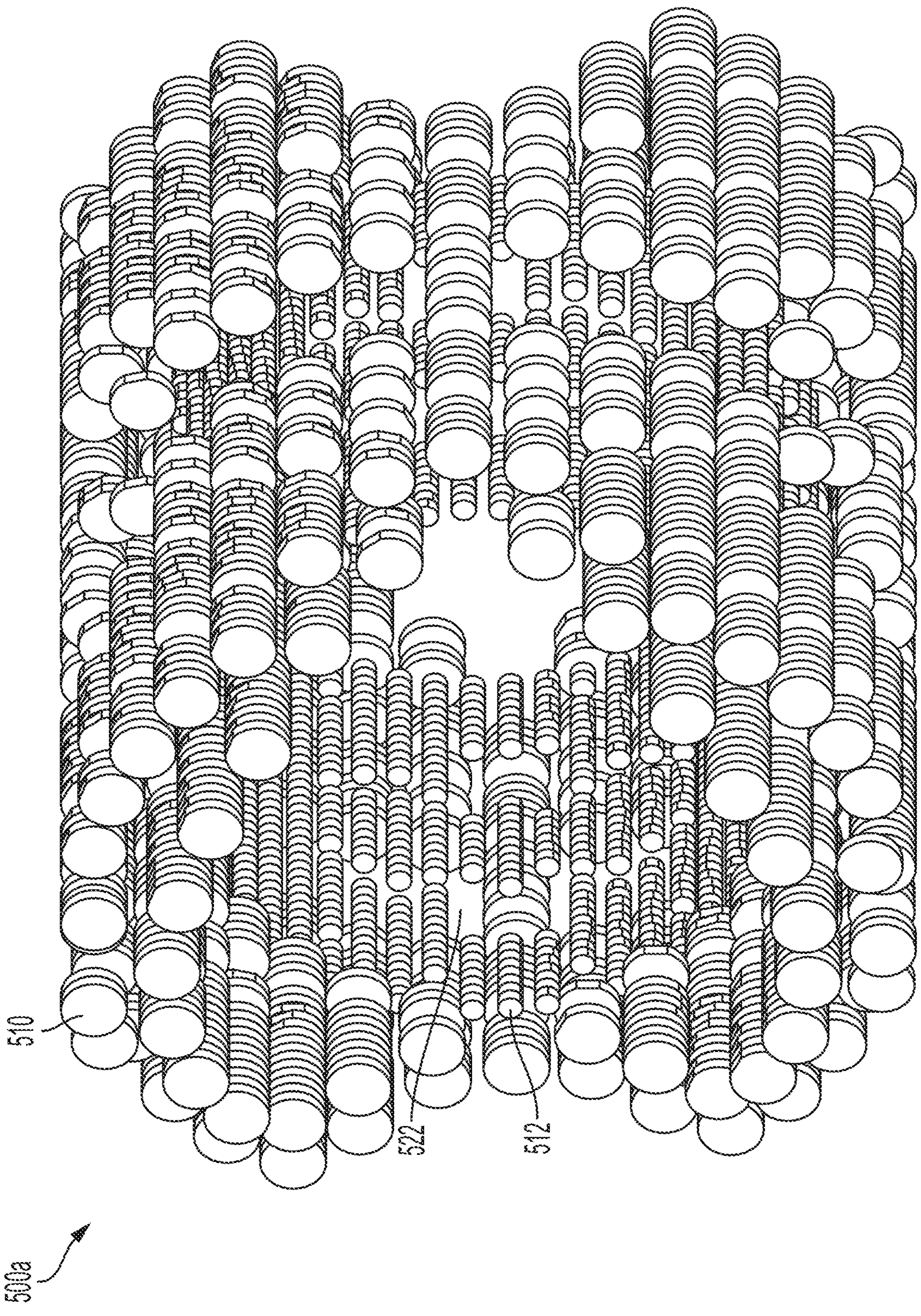
FIGS. 5A-5C illustrate embodiments of a magnetic assembly including differently-sized magnetic segments, in accordance with some embodiments of the technology described herein.
Figure 5B:
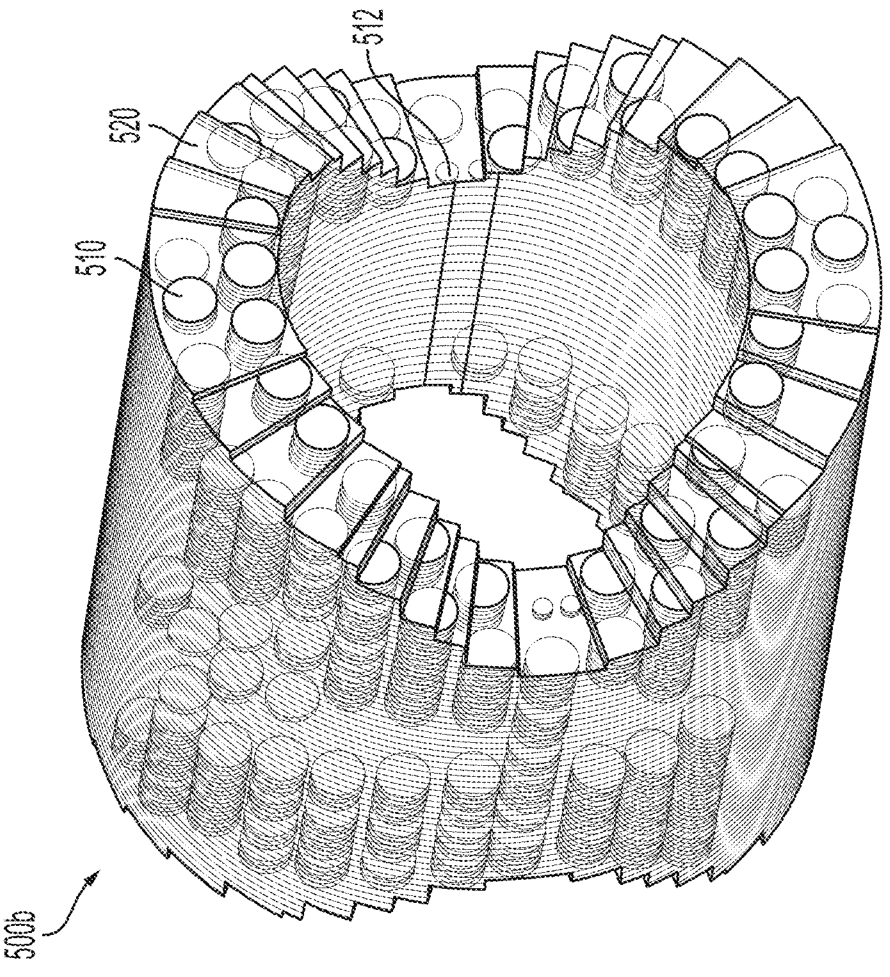

In some embodiments, the ferromagnetic segments 210 may be formed as solid rods, as depicted in FIG. 2A. However, in other embodiments, ferromagnetic segments 210 may be assembled from rows of shorter ferromagnetic tokens, as depicted in the examples of FIGS. 5A and 5B. One or more of the ferromagnetic segments 210 and/or the ferromagnetic tokens may have an at least partially cylindrical shape. For example, the ferromagnetic segments 210 and/or the ferromagnetic tokens may be shaped as a truncated cylinder (e.g., a cylinder with a flat surface elongated along the common longitudinal direction of the bore). In such embodiments, the magnetic orientation of the ferromagnetic segments 210 and/or the ferromagnetic tokens may be aligned with the flat surface of the ferromagnetic segments 210. For example, the magnetic orientation may be aligned along a direction that is perpendicular to the flat surface. An example of such a ferromagnetic segment 210 is depicted in FIG. 2C, where the magnetization of the ferromagnetic segments 210 is aligned with a direction perpendicular to the flat surface 211. Alternatively, the magnetic orientation may be aligned along a direction that is parallel to the flat surface or the magnetic orientation may be aligned along any desired angle relative to the flat surface. In some embodiments, the magnetic orientation may additionally be aligned with a plane that is perpendicular to the common longitudinal direction of the bore of the rectangular magnetic assembly 200.

The rectangular magnetic assembly 200 may also include non-ferromagnetic segments 220, in accordance with some embodiments of the technology described herein. The non-ferromagnetic segments 220 may be formed of non-magnetic materials (e.g., plastic, fiberglass). In some embodiments, the non-ferromagnetic segments 220 may have the same size and shape as ferromagnetic segments 210. Alternatively, the non-ferromagnetic segments 210 may be differently sized and/or shaped than the ferromagnetic segments 210. In some embodiments, the non-ferromagnetic segments 210 may be filled with transparent materials or may be left open to provide holes for air. Such embodiments may reduce claustrophobia experienced by a patient being imaged within the MRI system and may increase patient comfort.

In some embodiments, the ferromagnetic segments 210 and non-ferromagnetic segments 220 may be positioned in rods having lengths along the common longitudinal direction. The rods may be positioned to provide a substantially homogenous magnetic field of a desired strength in the central region (e.g., the field of view (FOV) or imaging region) of the bore. Additionally, locations of ferromagnetic segments 210 and non-ferromagnetic segments 220 within each of the rods may be positioned to provide a magnetic field of a desired strength and homogeneity in the central region of the bore. For example, the $B_0$ magnetic field may have a homogeneity of 500 ppm over a volume having a diameter of approximately 20 cm (or any other diameter in the range of 15-25 cm). Alternatively, the $B_0$ magnetic field may have a homogeneity over a volume having a diameter of approximately 20 cm (or any other diameter in the range of 15-25 cm) in a range from 10 ppm to 1000 ppm, from 100 ppm to 500 ppm, from 500 ppm to 1000 ppm, from 200 ppm to 800 ppm, or any other suitable range within the aforementioned ranges. In some embodiments, the $B_0$ magnetic field within the central region of the bore of rectangular magnetic assembly 200 may have a strength in a range from 0.05 T to 0.2 T. Alternatively or additionally, the $B_0$ magnetic field may have a strength in a range from 0.05 T and 0.1 T (e.g., 0.064 T).

In some embodiments, the bore of the rectangular magnetic assembly 200 may have a square cross-section with a width and height selected to accommodate a patient's torso. For example, the bore of the rectangular magnetic assembly 200 may have a square cross-section with a width and a height of 70 cm. In such embodiments, the length of the rectangular magnetic assembly 200 may be less than or equal to 1 m. For such dimensions, the rectangular magnetic assembly 200 may comprise approximately 350 kg of permanent magnet material. Alternatively, for assemblies of other dimensions, the weight of the permanent magnet material may be in a range from 300 kg to 400 kg or from 275 kg to 425 kg. In some embodiments, the weight of the permanent magnet material may be reduced by introducing steel in the sides of the rectangular magnetic assembly 200 at suitable positions to increase DC field efficiency of the rectangular magnetic assembly 200.

The rectangular shape of rectangular magnetic assembly 200 may allow for the placement of the gradient coils (e.g., gradient coils 128) of the MRI system within the bore of the rectangular magnetic assembly 200, in accordance with some embodiments of the technology described herein. Placing the gradient coils within the bore of the magnet assembly positions the gradient coils closer to the FOV of the MRI system, reducing the power needed to furnish gradient magnetic fields during MR imaging procedures.

Figure 2B:
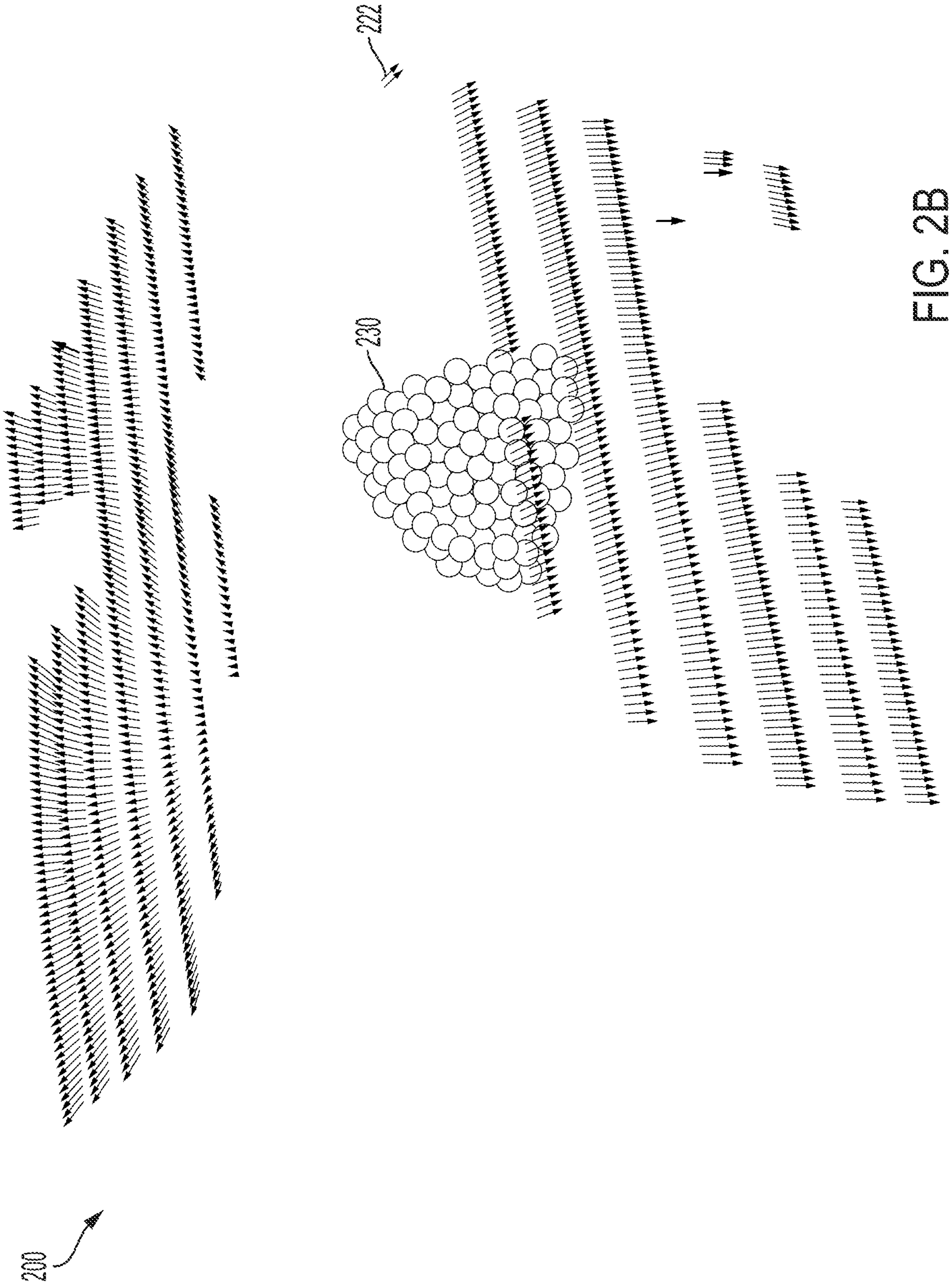
FIG. 2B illustrates magnetic moments of the magnetic assembly of FIG. 2A, in accordance with some embodiments of the technology described herein.
Figure 2C:
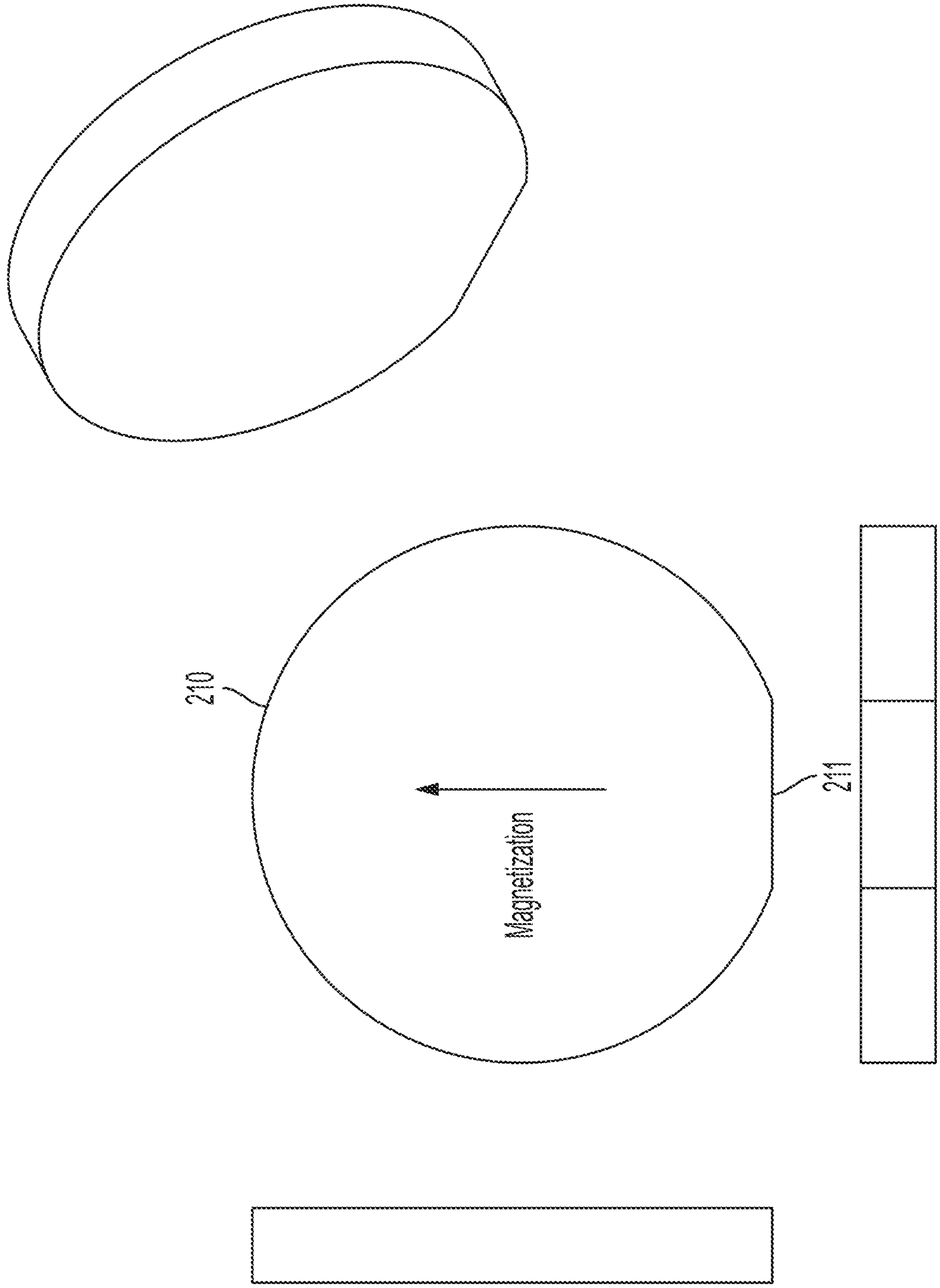
FIG. 2C depicts an illustrative ferromagnetic segment, in accordance with some embodiments of the technology described herein.

FIG. 2B depicts the magnetic moments 222 of the ferromagnetic segments 210 (not shown) of the rectangular magnetic assembly 200 of FIG. 2A, in accordance with some embodiments of the technology described herein. The magnetic moments 222 may have an orientation which varies based on the location within the rectangular magnetic assembly 200. In the example of FIG. 2B, the orientations of the magnetic moments 222 are unconstrained and may vary along three directions. In other embodiments, the magnetic moments 222 may be constrained to vary along two directions (e.g., the orientation of the magnetic moments 222 may be constrained to lie within a plane). In some embodiments, the orientation of magnetic moments 222 may be constrained to lie within a plane perpendicular to the common longitudinal direction of the bore.

In some embodiments, the orientations and locations of the magnetic moments 222 may be determined using a computational optimization process, examples of which are provided herein. Control points 230 are shown in FIG. 2B depicting points on a surface of a spherical FOV within the bore of the rectangular magnetic assembly 200. Control points 230 may be used during the computational optimization process to set desired magnetic field strengths and homogeneities of the rectangular magnetic assembly 200.

Figure 3A:
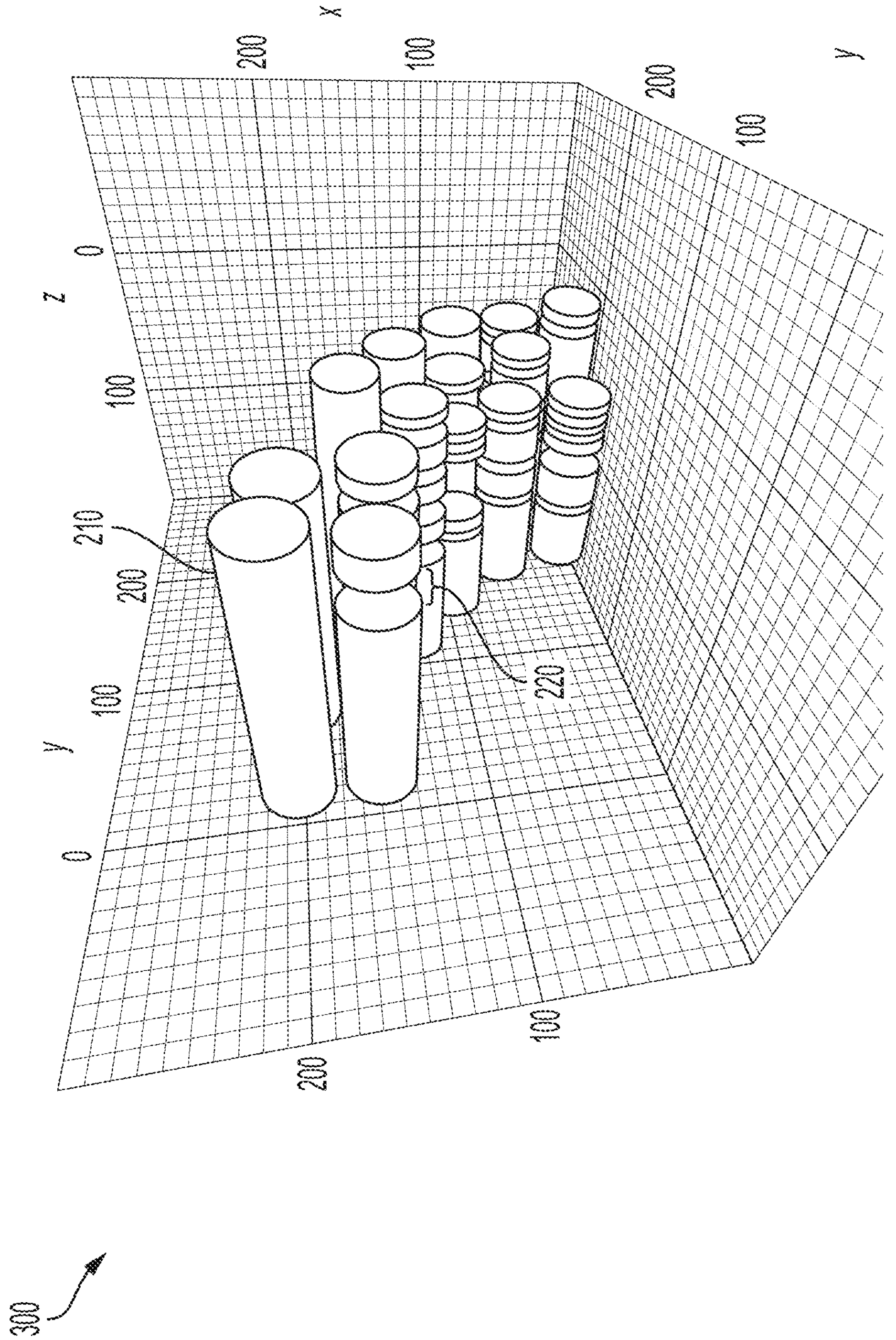
FIG. 3A illustrates an embodiment of a cylindrical magnetic assembly for providing a $B_0$ magnetic field for an MRI system, in accordance with some embodiments of the technology described herein.

FIG. 3A depicts a portion of a cylindrical magnetic assembly 300 for providing a $B_0$ magnetic field for an MRI system, in accordance with some embodiments of the technology described herein. The arrangement of ferromagnetic segments 210 and non-ferromagnetic segments 220 (not pictured) of the cylindrical magnetic assembly 300 is depicted in FIG. 3A for one-eighth of the total assembly. The portion of the cylindrical magnetic assembly 300 depicted in FIG. 3A may be suitably mirrored (e.g., across the x-, y-, and z-planes) to form a magnetic assembly having a cylindrical bore along a common longitudinal direction.

In some embodiments, it may be advantageous to make the cylindrical magnetic assembly 300 smaller and more close-fitting to the patient and FOV. In such embodiments, the gradient coils (e.g., gradient coils 128) of the MRI system may be positioned outside of the cylindrical magnetic assembly 300, rather than inside as in the case of rectangular magnetic assembly 200. Though the gradient coils may be positioned further from the FOV, thereby requiring more power to provide the same gradient field strength in the FOV, the gradient coils are also removed from the effects of the $B_0$ magnetic field, which may reduce an acoustic output level resulting from operation of the gradient coils.

Figure 3B:
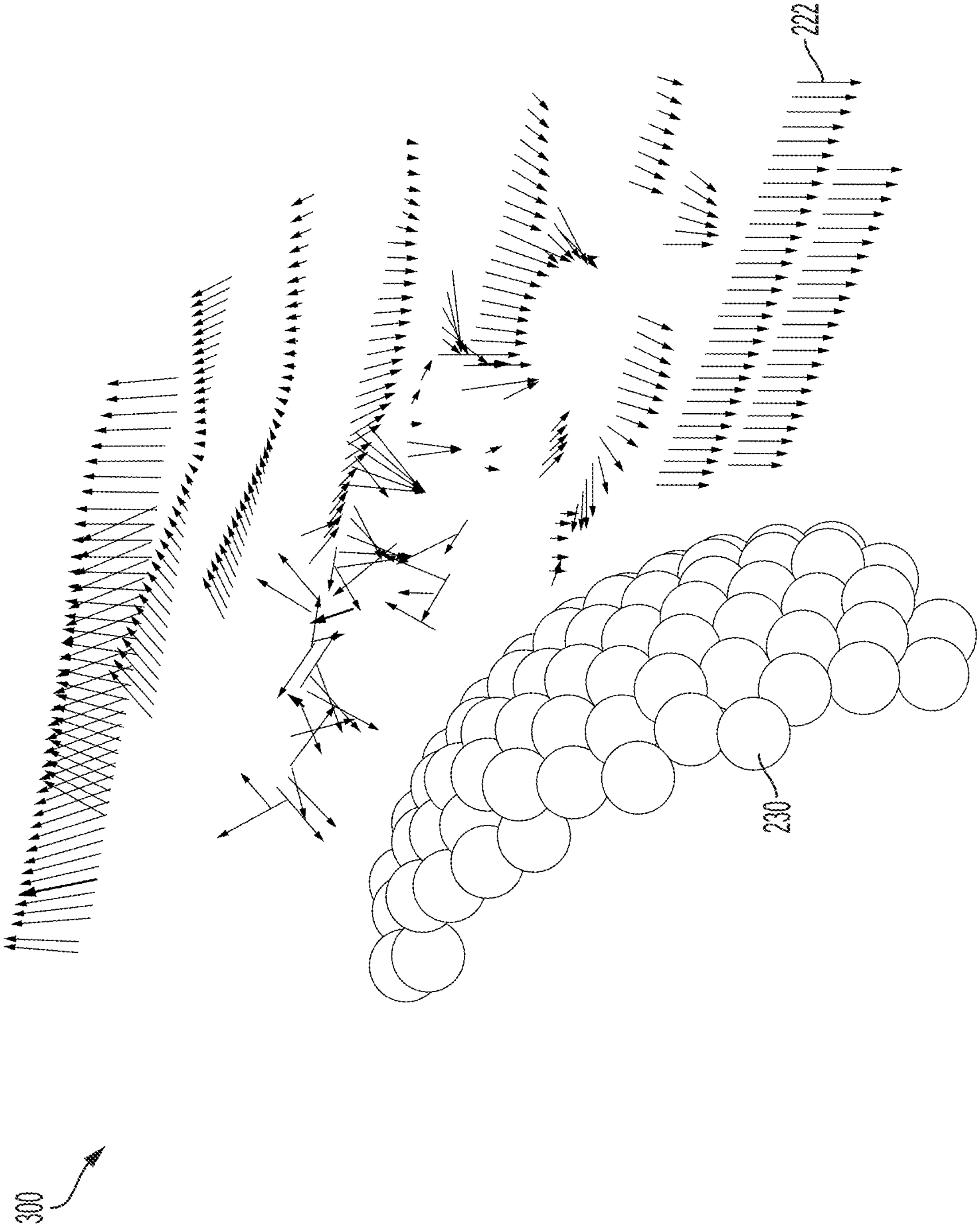
FIG. 3B illustrates magnetic moments of the magnetic assembly of FIG. 3A, in accordance with some embodiments of the technology described herein.

FIG. 3B depicts the magnetic moments 222 of the ferromagnetic segments 210 (not shown) of the cylindrical magnetic assembly 300 of FIG. 3A, in accordance with some embodiments of the technology described herein. Control points 230 are shown in FIG. 3B depicting points on a surface of a spherical FOV within the bore of the magnetic assembly 300.

Figure 4A:
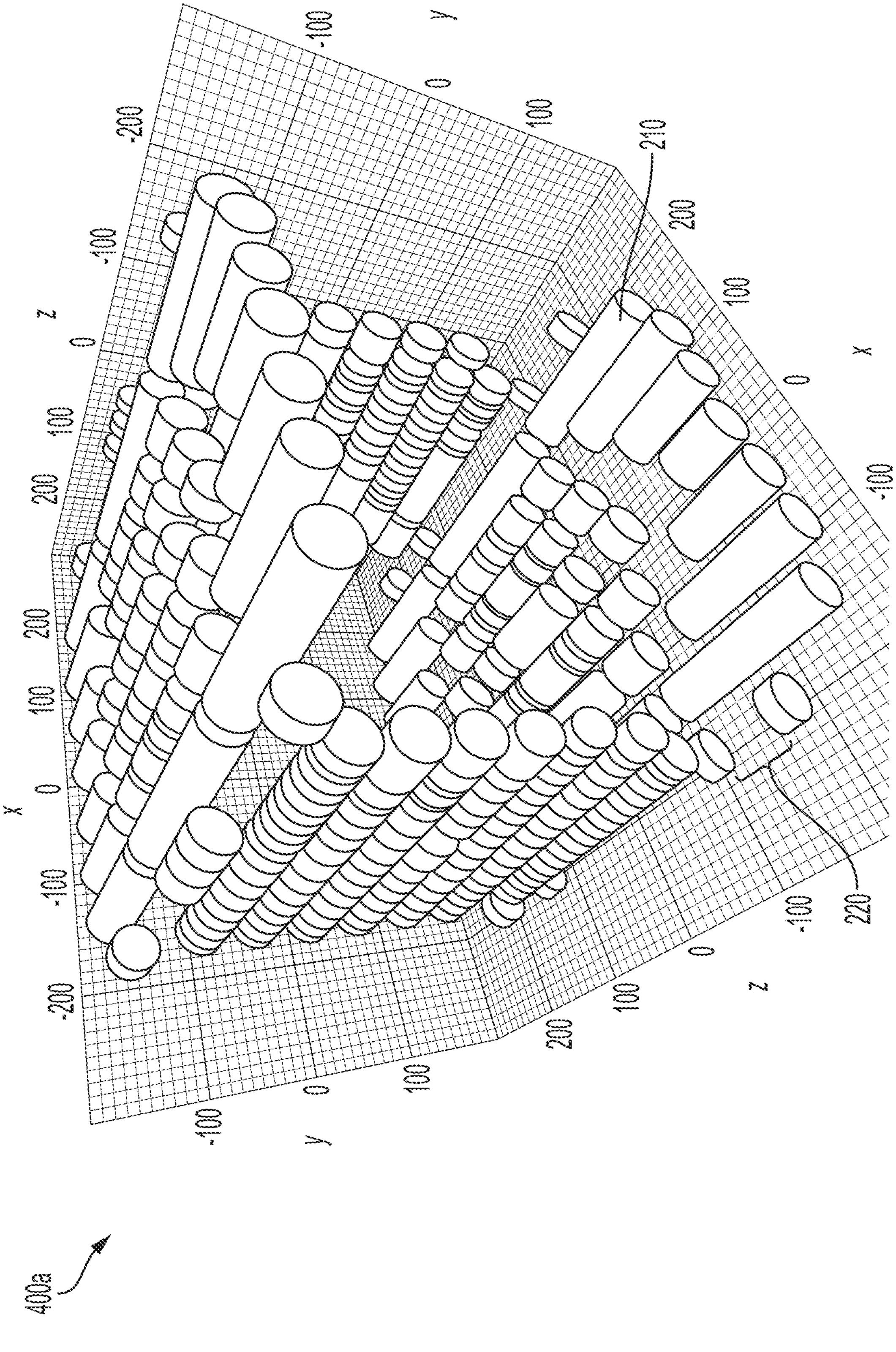
FIG. 4A illustrates an embodiment of a rectangular magnetic assembly configured to accommodate a patient's shoulder, in accordance with some embodiments of the technology described herein.
Figure 4B:
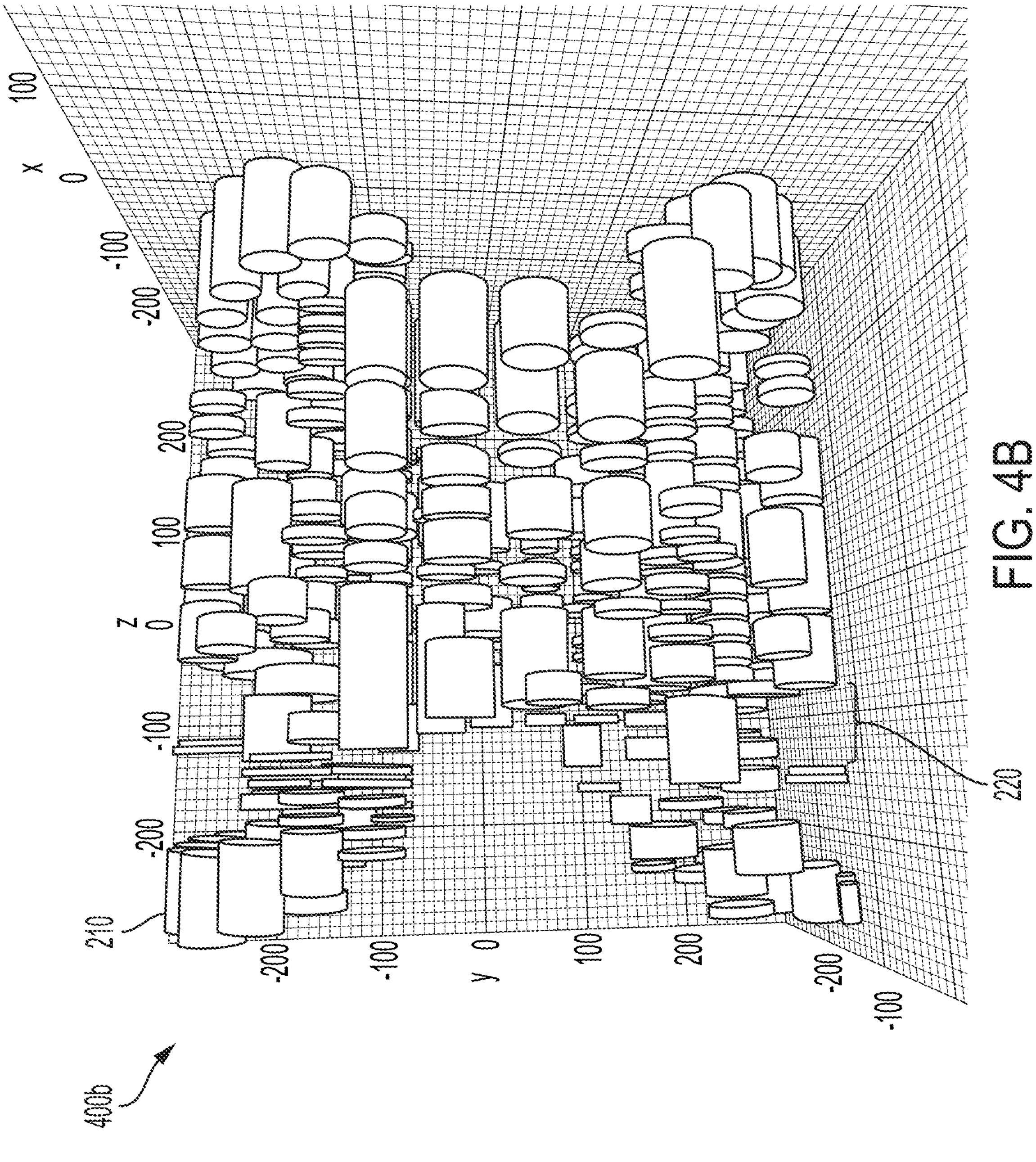
FIGS. 4B-4C illustrate embodiments of a cylindrical magnetic assembly configured to accommodate a patient's shoulder, in accordance with some embodiments of the technology described herein.
Figure 4C:
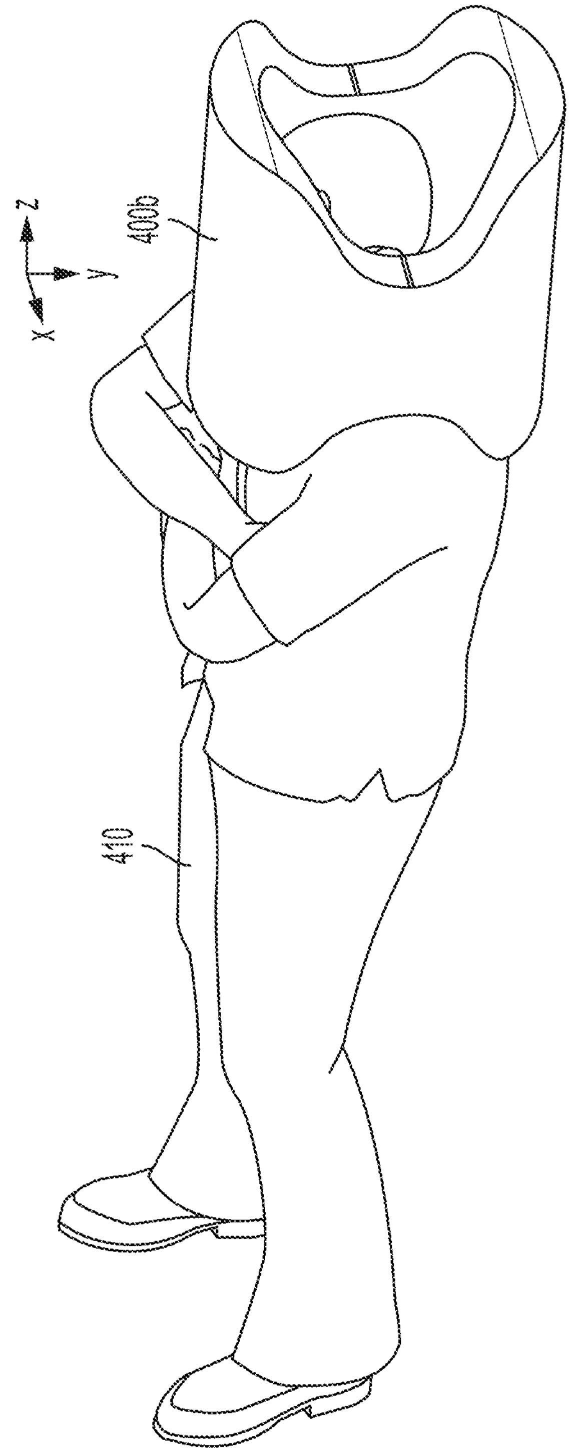

Alternatively, the structure of the magnetic assembly may be configured to improve accessibility to the FOV of the MRI system. For example, the magnetic assembly may be configured to accommodate a patient's shoulders when imaging the patient's head. FIG. 4A depicts an example of a rectangular magnetic assembly 400*a* including cut outs 430 configured to accommodate a patient's shoulder, in accordance with some embodiments of the technology described herein. FIGS. 4B-4C depict an example of a cylindrical magnetic assembly 400*b* configured with sigmoid-profiled shoulder cut-outs to accommodate the shoulders of patient 410, in accordance with some embodiments of the technology described herein.

In some embodiments, such cut-outs may reduce the total weight of the magnetic assembly 400*a,b*. The cut-outs may functionally increase the length of the magnetic assembly relative to the width of the magnetic assembly while still allowing the patient to comfortably access the FOV of the MRI system. Increasing the length of the magnetic assembly may improve magnetic field homogeneity and efficiency and may reduce the amount of permanent magnet material needed to form the magnetic assembly. For example, a magnetic assembly (e.g., cylindrical magnetic assembly 400*b*) having a bore with a diameter of 320 mm, a length of 450 mm, and shoulder cut outs having a length of 200 mm may be composed of 60-70 kg of permanent magnet material to provide a magnetic field of 65 mT if the magnetization of the ferromagnetic segments is constrained to a plane perpendicular to the common longitudinal direction. Comparably, a cylindrical magnet assembly (e.g., cylindrical magnet assembly 300) having a same width and length (e.g., having a 1:1 aspect ratio) with an inner diameter of 320 mm may be composed of approximately 150 kg of permanent magnet material to provide a same magnetic field and homogeneity.

FIG. 5A depicts a magnetic assembly 500*a* including first ferromagnetic segments 510 and second ferromagnetic segments 512 positioned to form a bore extending along a common longitudinal direction, in accordance with some embodiments of the technology described herein. First ferromagnetic segments 510 and second ferromagnetic segments 512 may be formed of the same materials as and may be shaped in a same manner as ferromagnetic segments 210 of FIGS. 2A-2B. However, first ferromagnetic segments 510 may have a different size than second ferromagnetic segments 512 so that first ferromagnetic segments 510 have a larger magnetic moment than second ferromagnetic segments 512. For example, the first ferromagnetic segments 510 may have a diameter greater (e.g., more than twice, three times, four times, five times, etc.) than that of second ferromagnetic segments 512. In some embodiments, first ferromagnetic segments 510 may have a diameter of approximately 30-42 mm (e.g., 36 mm) while second ferromagnetic segments 512 may have a diameter of approximately 8-20 mm (e.g., 14 mm).

The magnetic assembly 500*a* may also include non-ferromagnetic segments at spaces 520, 522 (the non-ferromagnetic segments that go in these spaces are themselves not shown in this figure). In some embodiments, the non-ferromagnetic segments in spaces 520, 522 may be spacers formed of any suitable non-ferromagnetic material(s) (e.g., plastic, fiberglass). The spacers may have the same size and shape as the first ferromagnetic segments 510 and second ferromagnetic segments 512, respectively, and may be interspersed with the ferromagnetic segments. For example, one or more ferromagnetic segments may be followed by one or more non-ferromagnetic segments along the length of the rod. Additionally or alternatively, in some embodiments one or more ferromagnetic segments may be positioned between at least two non-ferromagnetic segments (e.g., at least one non-ferromagnetic segment may be positioned on either side of the one or more ferromagnetic segments). In some embodiments, instead of non-ferromagnetic segments, the spaces (e.g., 520, 522) may be left empty to provide increased accessibility to the bore and/or to reduce claustrophobia and increase patient comfort.

In other embodiments, the non-ferromagnetic segments in spaces 520, 522 may be provided by a non-ferromagnetic frame configured to house the first ferromagnetic segments 510 and second ferromagnetic segments 512. For example, as depicted in the example of FIG. 5B, non-ferromagnetic segments may be formed as non-ferromagnetic sheets 530 configured to house the first ferromagnetic segments 510 and second ferromagnetic segments 512. Non-ferromagnetic sheets 530 may be formed as annular and/or semi-annular slices of a hollow cylinder extending along the bore of the magnetic assembly 500. The non-ferromagnetic sheets 530 may be glued together to form magnetic assembly 500*b*. Alternatively or additionally, the non-ferromagnetic sheets

530 may be secured together to form magnetic assembly 500*b* using threaded rods and suitable nuts.

Figure 5C:
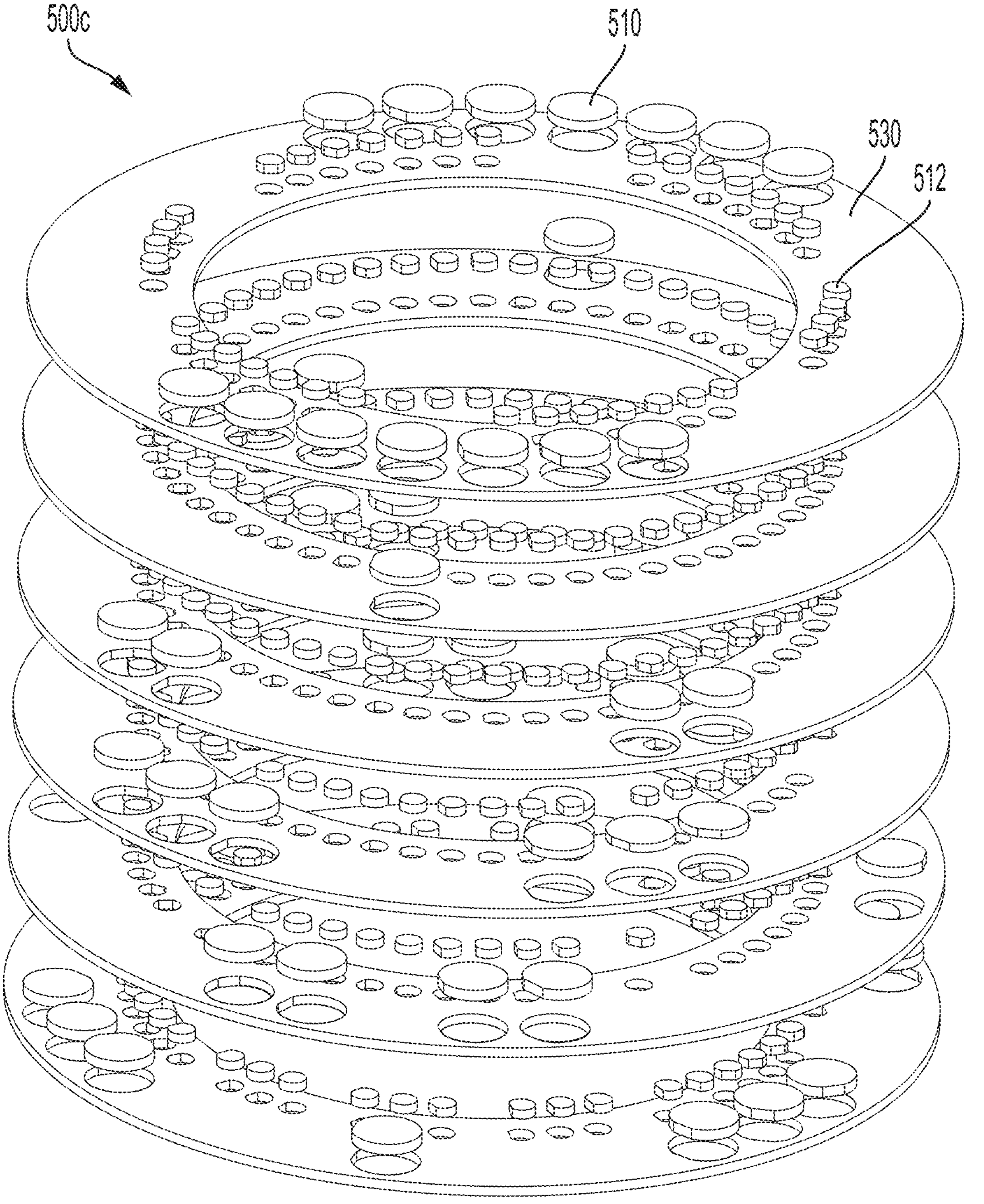

In some embodiments, non-ferromagnetic sheets 530 may include slots configured to house first ferromagnetic segments 510 and second ferromagnetic segments 512. The slots may be machined to indicate an orientation of the first ferromagnetic segments 510 and second ferromagnetic segments 512 (e.g., the slots may include a flat surface which mirrors a flat surface of the ferromagnetic segments). FIG. 5C shows an exploded view of a magnetic assembly 500*b* in which these machined slots may be seen.

Figure 6:
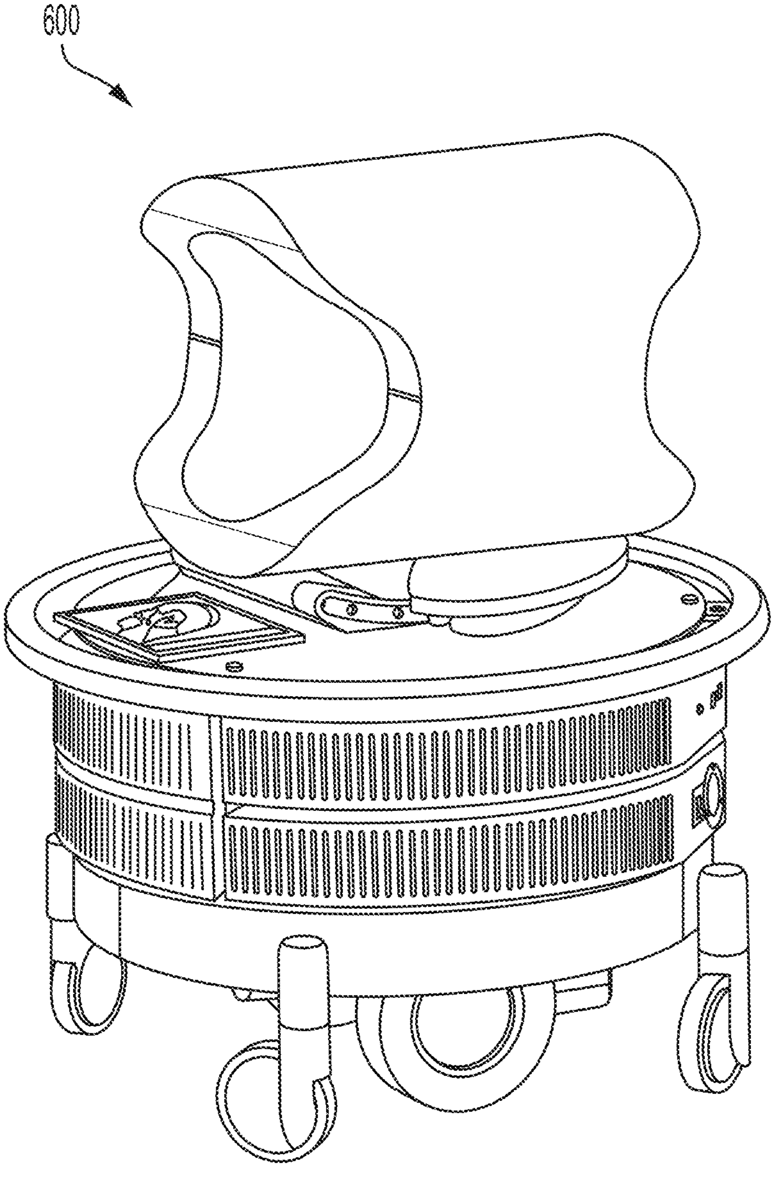
FIG. 6 illustrates an MRI system including the magnetic assembly of FIG. 5C, in accordance with some embodiments of the technology described herein.

Using the techniques described herein, the inventors have developed portable, low power MRI systems capable of being brought to the patient, providing affordable and widely deployable MRI where it is needed. FIG. 6 shows an example of a portable, low-field MRI system 600 including the magnetic assembly 400*b* of FIG. 4C, in accordance with some embodiments of the technology described herein. The magnetic assembly 400*b* may be supported by a base 610. Base 610 may house the power components and/or electronics discussed in connection with FIG. 1, including power components configured to operate the MRI system 600.

Base 610 may also include one or more transport mechanisms 620 which enable point-of-care use of MRI system 600, in accordance with some embodiments of the technology described herein. In the example of FIG. 6, the transport mechanisms 620 are depicted as wheels, but other transport mechanisms may be used. In some embodiments, transport mechanisms 620 may include a motorized component 625 may be provided to allow the MRI system 600 to be driven from location to location, for example, using a control such as a joystick or other control mechanism provided on or remote from the MRI system 600. In this manner, MRI system 600 can be transported to the patient and maneuvered to the bedside to perform imaging, as illustrated in FIG. 7.

Figure 7:
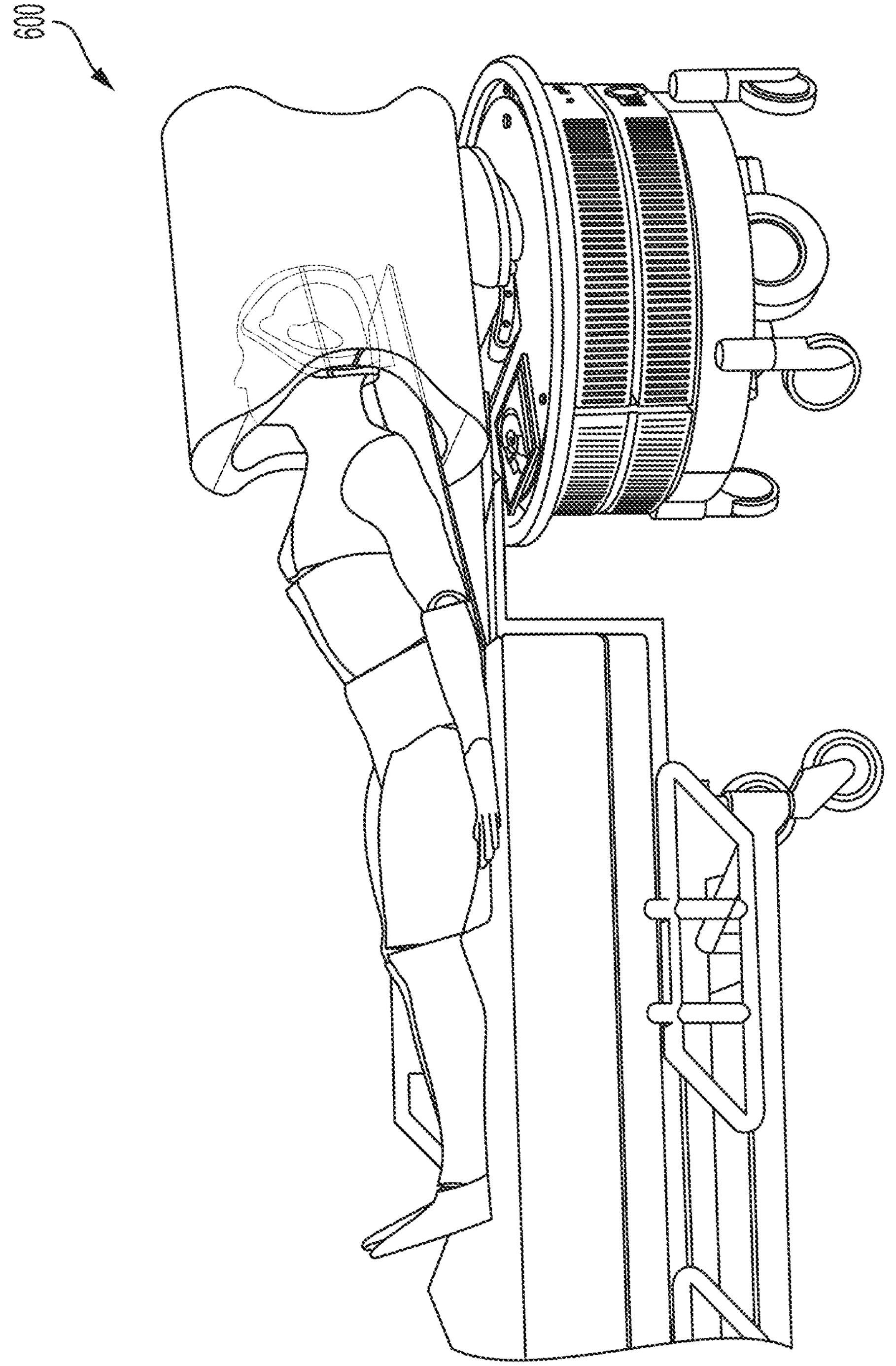
FIG. 7 illustrates the use of the MRI system of FIG. 6 to image a patient's head, in accordance with some embodiments of the technology described herein.

FIG. 7 depicts the use of the portable MRI system of FIG. 6 to perform a brain scan of a patient, in accordance with some embodiments of the technology described herein. During the brain scan, the MRI system 600 may be used to capture at least one magnetic resonance image of the patient for clinical use.

Figure 8:
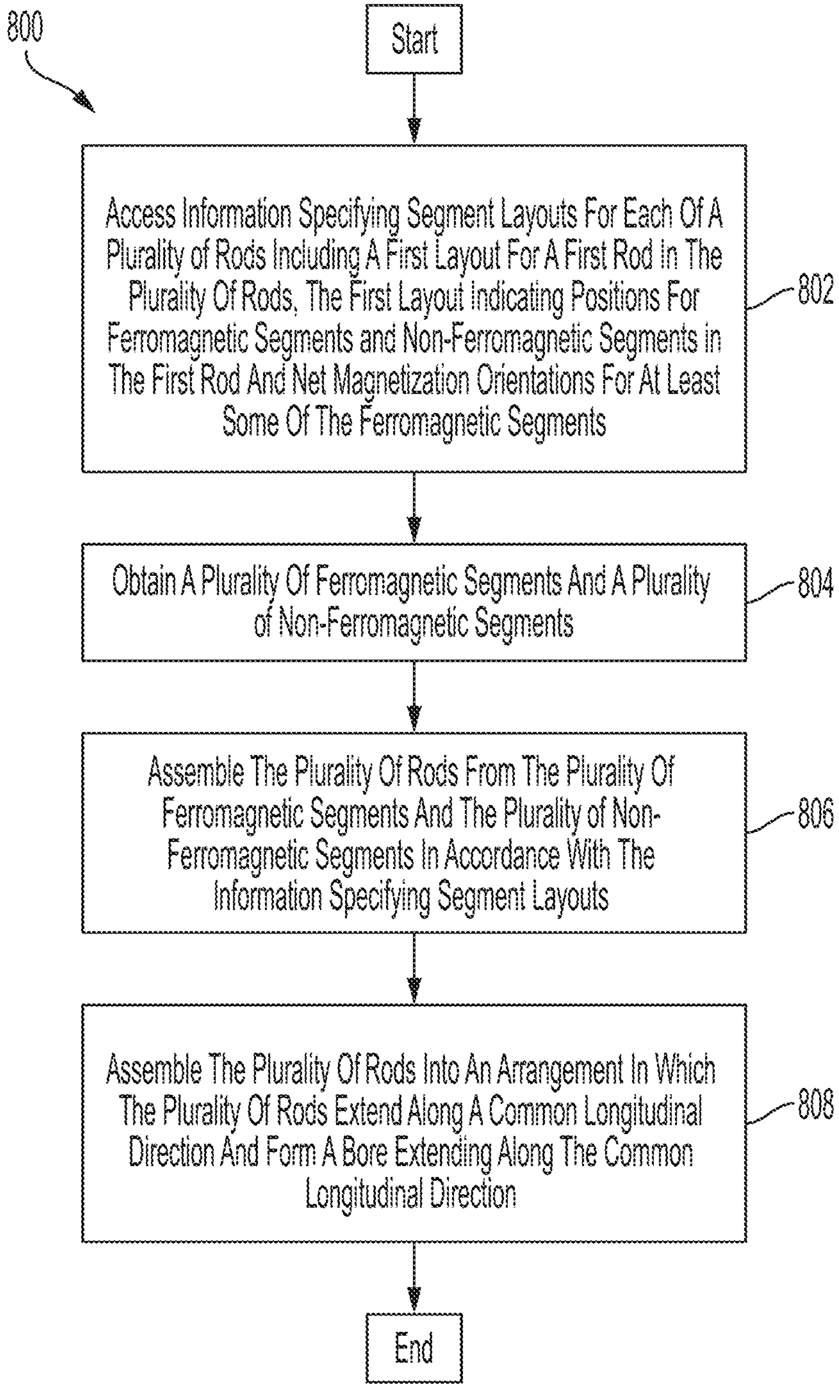
FIG. 8 is a flowchart illustrating a process 800 of manufacturing a magnetic assembly, in accordance with some embodiments of the technology described herein.

The inventors have further developed methods of manufacturing magnetic assemblies (e.g., magnetic assemblies 200, 300, 400*a*, 400*b*, and/or 500). FIG. 8 is a flowchart illustrating a process 800 of manufacturing a magnetic assembly, in accordance with some embodiments of the technology described herein.

Process 800 begins at act 802, where information specifying segment layouts for one or more rods may be accessed. The information specifying segment layouts may be accessed from any suitable source and may be in any suitable format, as aspects of the technology described herein are not limited in this respect.

In some embodiments, the information accessed at act 802 may include a first layout for a first rod in the plurality of rods. The first layout may indicate the position of ferromagnetic segments and non-ferromagnetic segments in the first rod. The first layout may also indicate orientations of the net magnetization for at least some of the ferromagnetic segments in the first rod.

Next, at act 804, a plurality of ferromagnetic segments and a plurality of non-ferromagnetic segments may be obtained. The ferromagnetic segments may be any of the types ferromagnetic segments described herein (e.g., ferromagnetic segments 210, 510, and/or 512). The non-ferromagnetic segments may be any of the types of non-ferromagnetic segments described herein (e.g., non-ferromagnetic segments 220, 520, and/or 522).

Next, at act 806, the plurality of rods may be assembled. Assembling the plurality of rods may include assembling the rods from the plurality of ferromagnetic segments and the plurality of non-ferromagnetic segments obtained in act 804. Assembling the plurality of rods may also include assembling the rods in accordance with the information specifying segment layouts. For example, assembling the plurality of rods may include placing ferromagnetic segments and non-ferromagnetic segments in particular segment locations along the rod (e.g., at locations specified by the information accessed at act 802). Placing the ferromagnetic segments may additionally include orienting at least some of the ferromagnetic segments so that the magnetic moments of the at least some ferromagnetic segments are aligned along specified directions provided by the information specifying segment layouts.

Next, at act 808, the plurality of rods may be assembled into an arrangement to form a magnetic assembly (e.g., any of magnetic assemblies 200, 300, 400*a*, 400*b*, or 500 as described herein). The plurality of rods may be positioned to extend along a common longitudinal direction and to form a bore extending along the common longitudinal direction. In some embodiments, the bore may be cylindrical in shape. In other embodiments, the bore may be rectangular in shape.

In some embodiments, the information specifying segment layouts may be generated using computational optimization methods. Such computation optimization methods may be performed using any suitable computing environment executing suitable optimization software.

In some embodiments, cone programming may be used to generate the information specifying segment layouts. In such embodiments, the magnetic field generated by a ferromagnetic segment of a specified shape, size, and magnetization with components along one or more of the x-, y-, and z-directions may be computed. For example, for each segment location, i, a density variable $X_i$ may be used to determine the amplitude of the magnetization, the amplitude ranging from 0 to 1. For each location, a set of three variables $$M_i^{(x)}, M_i^{(y)}, M_i^{(z)}$$

with values between −1 and 1 may be defined. The density variable $X_i$ may constrain these variables according to the following expression:

$$\sqrt{\left(M_i^{(x)}\right)^2 + \left(M_i^{(y)}\right)^2 + \left(M_i^{(z)}\right)^2} \leq X_i.$$

This constraint may ensure that the mix of the three magnetization orientations results in a magnetization vector with a magnitude that is smaller than the density variable.

In some embodiments, a set of control points (e.g., control points 230) may be defined, the control points being evenly distributed on a surface of a sphere englobing the FOV. The field strength at each control point may be set and defined as sum of the effects of each type and orientation of magnetization in each segment location. This constraint may be written as:

$$\sum_i \left(M_i^{(x)} B_i^{(x)}(u_j) + M_i^{(y)} B_i^{(y)}(u_j) + M_i^{(z)} B_i^{(z)}(u_j)\right).$$

Prescribing a field strength and homogeneity is equivalent to constraints setting boundaries to the values just defined. In the end, the problem is posed as:

$$\underset{X, M^{(x)}, M^{(y)}, M^{(z)}}{\text{minimize}} \sum_i X_i V_i$$

such that:

$$\sqrt{(M_i^{(x)})^2 + (M_i^{(y)})^2 + (M_i^{(z)})^2} \leq X_i$$

$$b_0 - \delta b \leq \sum_i (M_i^{(x)} B_i^{(x)}(u_j) + M_i^{(y)} B_i^{(y)}(u_j) + M_i^{(z)} B_i^{(z)}(u_j) \leq b_0 + \delta b$$

$$0 \leq X_i \leq 1$$

$$X \in \mathbb{R}^P$$

where P is the number of slots, $V_i$ is the volume of the block in location i, $b_0$ is the desired field strength, and δb the desired maximum excursion of field from $b_0$ in all control points. This problem may be solved, and the segment locations determined, using cone programming, an extension of linear programming.

However, the problem as described above allows the overall magnetization vector magnitude in each location to take a fractional value between 0 and 1. This may not be desirable as it implies a segment with partial magnetization. One solution may be to reduce the size of the block. Alternatively, to simplify assembly and manufacturing, it may be desirable to limit the magnetization of the segments to be either 0 or 1 and to use integer programming, reformulating the problem as:

$$\underset{X, M^{(x)}, M^{(y)}, M^{(z)}}{\text{minimize}} \sum_i X_i V_i$$

such that:

$$\sqrt{(M_i^{(x)})^2 + (M_i^{(y)})^2 + (M_i^{(z)})^2} \leq X_i$$

$$b_0 - \delta b \leq \sum_i (M_i^{(x)} B_i^{(x)}(u_j) + M_i^{(y)} B_i^{(y)}(u_j) + M_i^{(z)} B_i^{(z)}(u_j) \leq b_0 + \delta b$$

$$0 \leq X_i \leq 1$$

$$X \in \mathbb{N}^P$$

In this case, all density variables may be integers. The $L_1$ nature of the cost function may result in driving the $M_i$ variables to their bounds so that very few segment locations have partial magnetizations.

In some embodiments, it may also be desirable to include additional constraints. For example, it may be desirable to constrain the field strength outside of the magnetic assembly (e.g., to constrain the fringe magnetic fields and reduce the radius of the 5 Gauss line). In this manner, the orientation of the magnetic moments within the assembly may be chosen to reduce the strength of magnetic fields outside of the assembly.

The above-described cone programming approach would generate information that may be provided to a manufacturer of ferromagnetic segments so that the manufacturer may produce the segments for use in constructing a permanent magnet assembly with a non-ferromagnetic frame, in accordance with some embodiments of the technology described herein.

In other embodiments, a permanent magnetic assembly with a non-ferromagnetic frame may be assembled from a plurality of solid rods, rather than being assembled from a plurality of ferromagnetic and non-ferromagnetic segments. The solid rods may be formed using a swaging process, for example, as described in U.S. Patent Application Publication No.: 2019/0122818 filed Sep. 28, 2018 and titled "Method of Manufacturing Permanent Magnets," which is incorporated by reference in its entirety herein. In such embodiments, magnetic alloy powder may be placed in a hollow tube having a desired cross-sectional shape (e.g., circular, square, trapezoidal, etc.). The tube and magnetic alloy powder may then be swaged to form a solid magnetic rod, and the solid magnetic rod may be magnetized along one or more desired directions. In some embodiments, the bonding may comprise sintering the magnetic alloy powder. Alternatively, the magnetic alloy powder may only be swaged and may not be sintered. In other embodiments, the bonding may comprise mixing the magnetic alloy powder with a bonding agent prior to swaging. In such embodiments, the magnetic alloy powder may not be sintered. In some embodiments, the tube may be removed or partially removed (e.g., etched or abraded) from the solid magnetic material prior to assembly of the magnetic assembly.

In such embodiments, the solid rods may be produced using programmable pre-magnetization while swaging to create variable magnetization orientations within the solid rods. For example, first regions of the solid magnetic rod may be magnetized with different orientations than second regions of the solid magnetic rod using these methods, the first and second regions being located at different positions along a length of the solid magnetic rod.

Additionally, in some embodiments, the magnetic alloy powder may be programmably diluted with a binding agent to enable variable effective magnetization along the solid rods. For example, third regions of the solid magnetic rod may have a magnetic moment that is twice the magnitude of the magnetic moment of fourth regions of the solid magnetic rod. In some embodiments, fifth regions of the solid magnetic rod may have a substantially zero magnetic moment.

Figure 9A:
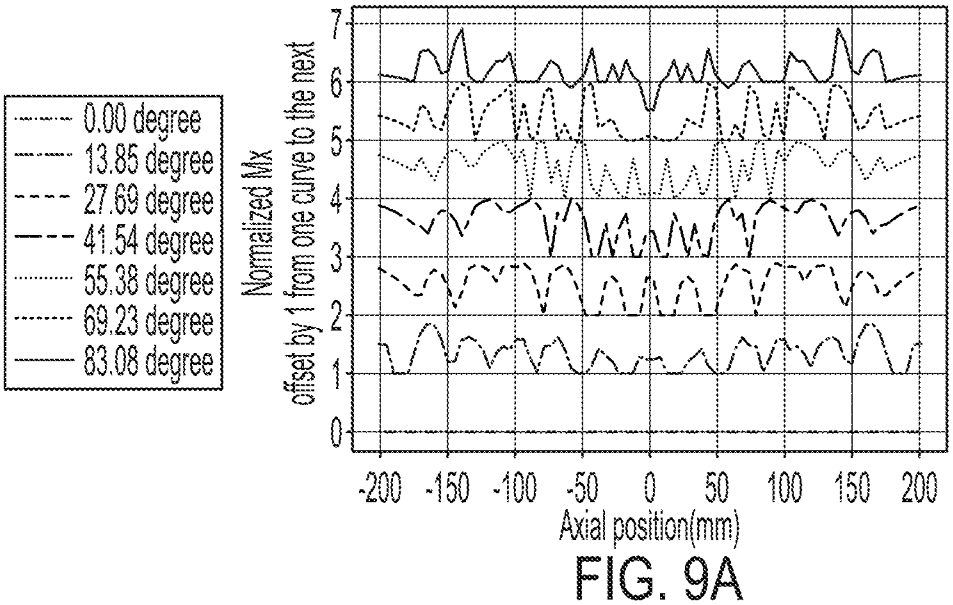
FIGS. 9A-9C depict examples of magnetization values for x-, y-, and z-components of magnetization along the length of a solid magnetic rod, in accordance with some embodiments of the technology described herein.
Figure 9B:
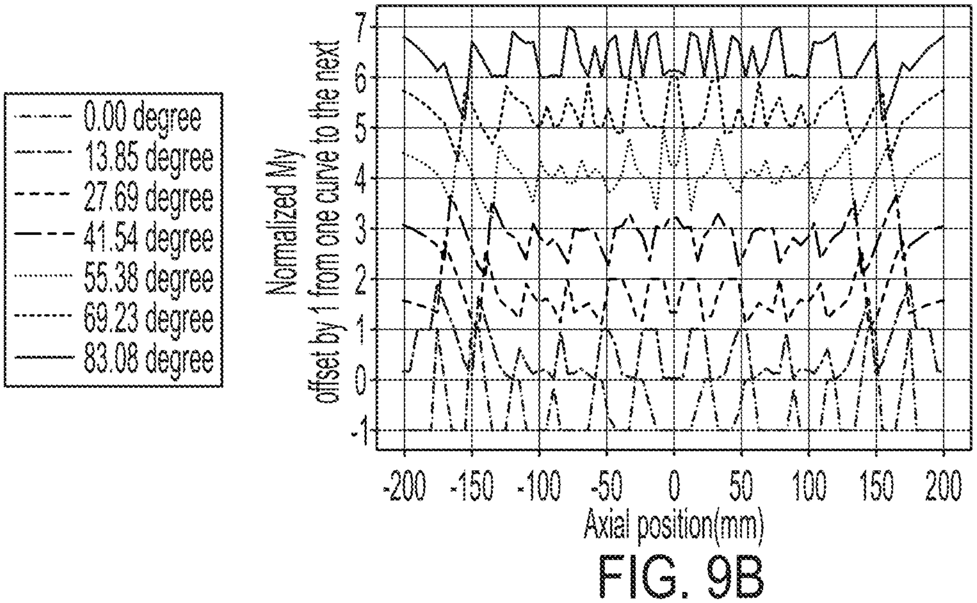
Figure 9C:
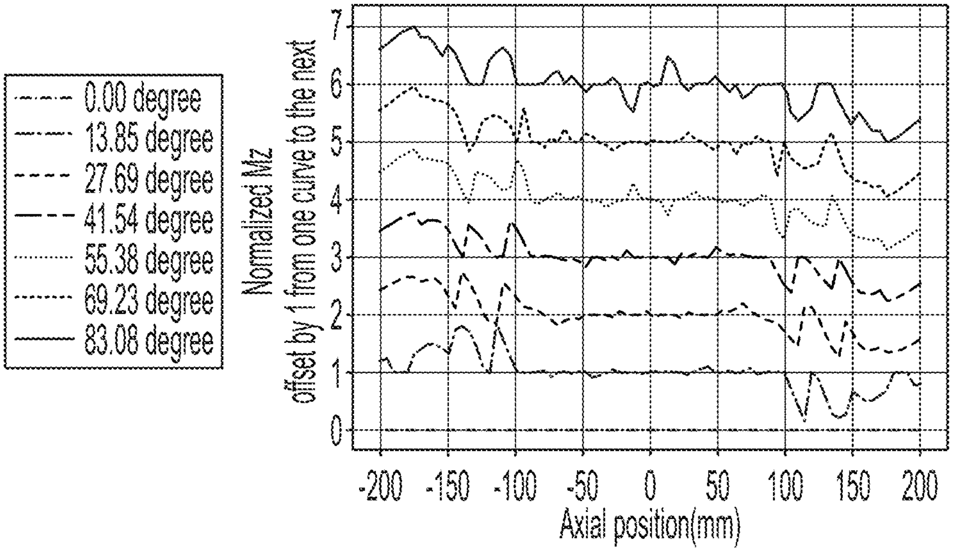

To produce such solid magnetic rods, for example, these rods may be formed with a specific sequence of currents driven in pre-magnetization coils along x-, y-, and z-axes. The pre-magnetization may occur as the rods are drawn and swaged. FIG. 9A-9C show examples of desired magnetization in all three directions for seven base rods of a 26-rod magnetic assembly. The entire assembly may be obtained by suitably mirroring (e.g., across the x-, y-, and z-planes). In some embodiments, these desired magnetization patterns may be used to compute the desired angles of the pre-magnetization field at each point along the length of the rod. These desired angles may be translated into waveforms for the pre-magnetization coils.

Figure 9D:
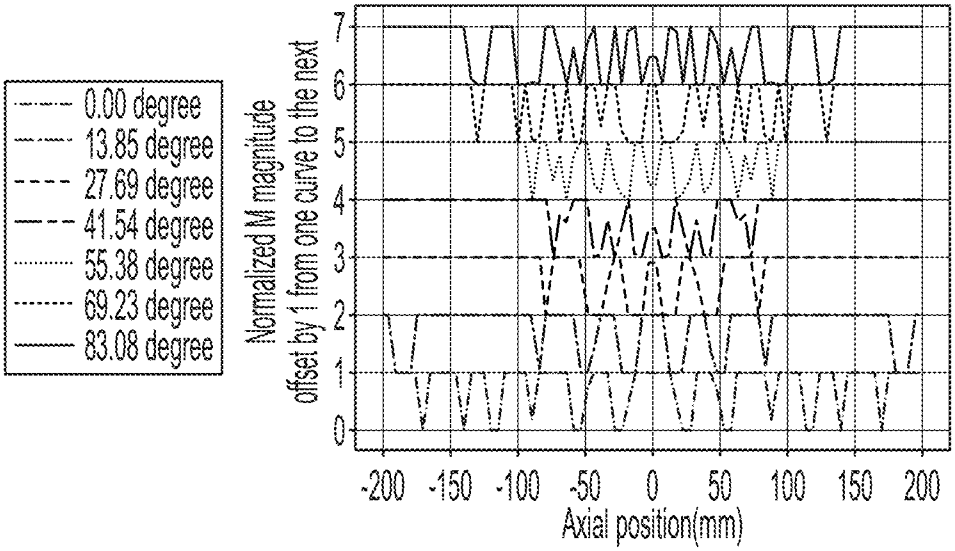
FIG. 9D depicts a total magnetization amplitude based on the magnetization values of FIGS. 9A-9C, in accordance with some embodiments of the technology described herein.

FIG. 9D shows an example of the total magnetization curve based off of the magnetization patterns in FIGS. 9A-9C. The total magnetization curve shows the dilution of the magnetic alloy powder along the length of the rod (e.g., varying between regions of 100% magnetic alloy powder and 100% non-magnetic powder). Alternatively, this computation could be performed with an integer solution in mind, which would result in solid magnetic rods consisting of first regions of magnetic material and second regions of non-magnetic material.

Figure 10A:
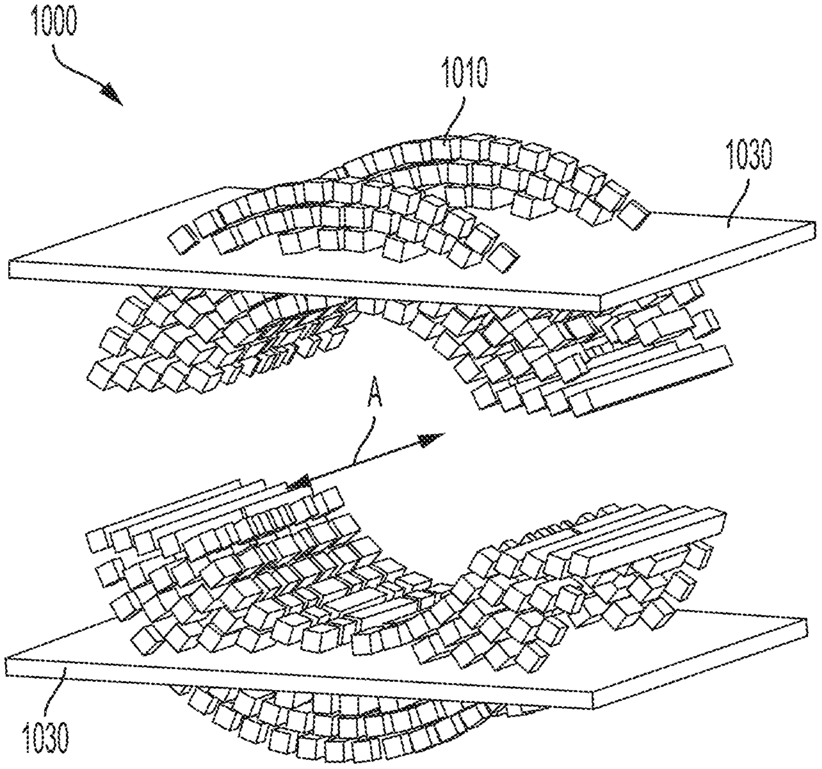
FIG. 10A illustrates an embodiment of a magnetic assembly including gaps for accommodating gradient coils, in accordance with some embodiments of the technology described herein.
Figure 10B:
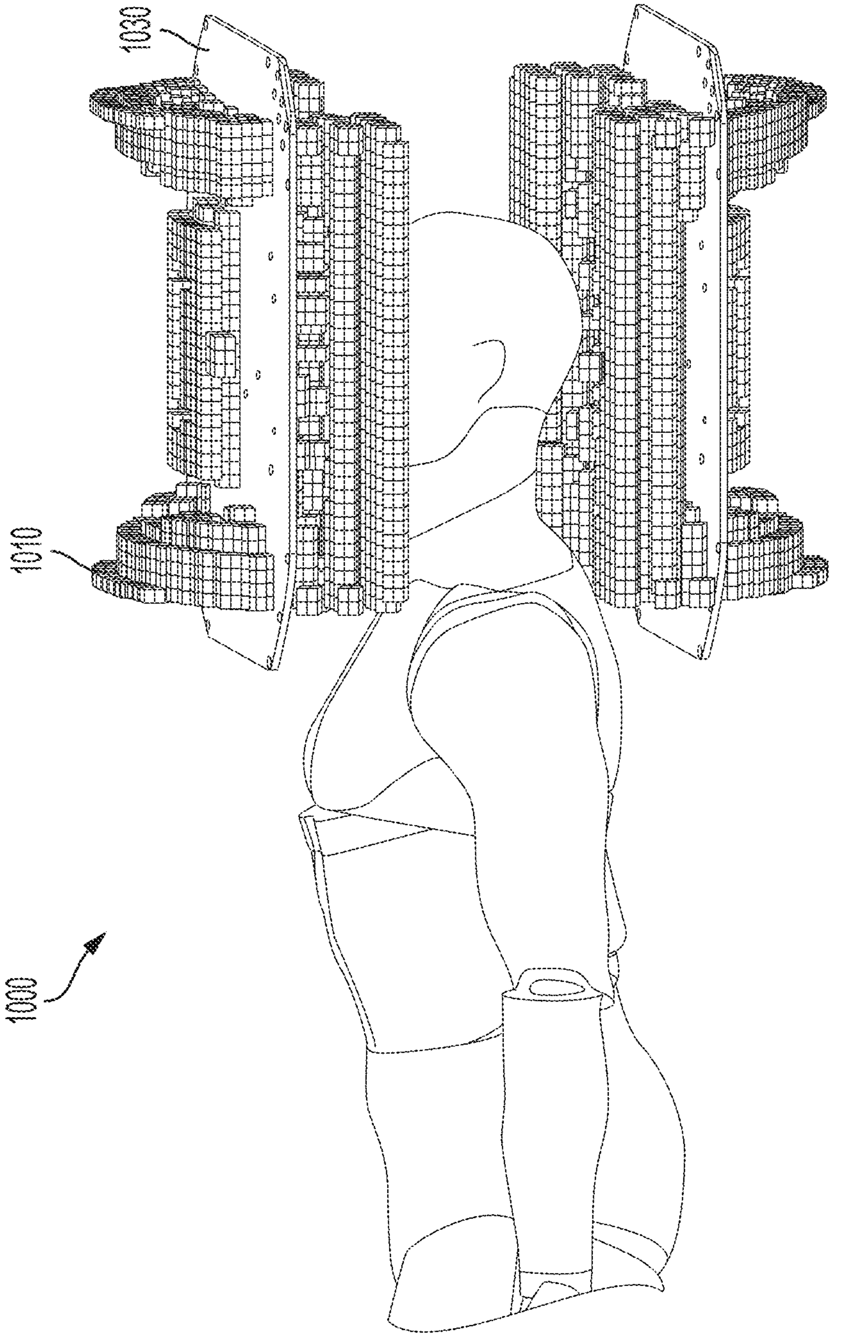
FIG. 10B illustrates the use of the magnetic assembly of FIG. 10A to image a patient's head, in accordance with some embodiments of the technology described herein.

FIG. 10A depicts a magnetic assembly 1000 including gaps for accommodating one or more gradient coils. For example, in some embodiments, the gaps accommodate insertion of one or more panels 1030 have gradient coils formed thereon. In some embodiments, the panels 1030 may include one or more additional magnetic components fabricated thereon. For example, in addition to or instead of gradient coils, the panels 1030 may include transmit/receive coil, and/or shim coils fabricated thereon as described herein. FIG. 10B illustrates the use of magnetic assembly 1000 to image a patient's head, in accordance with some embodiments of the technology described herein.

In some embodiments, the magnetic assembly 1000 may be formed out of an arrangement of ferromagnetic segments 1010. As shown in the example of FIG. 10A, the ferromagnetic segments 1010 may be positioned to form a cylindrical bore extending along a common longitudinal direction A. In some embodiments, the ferromagnetic segments 1010 may also be positioned such that they form two separated portions. The space between the two separated portions may be shaped to provide room for a portion of the patient's anatomy (e.g., shoulders) during MR imaging.

In some embodiments, the ferromagnetic segments 1010 may also be positioned to form gaps configured to accommodate insertion of panels 1030. The positioning of the ferromagnetic segments 1010 to form these gaps may be accomplished using a computational optimization process, examples of which are provided herein. To form these gaps using the computational optimization process, ferromagnetic segments may be barred from being placed within the regions of the gaps such that their positions are only determined outside of the gaps by the computational optimization process.

In some embodiments, ferromagnetic segments 1010 may be rectangular or cubic blocks or rods. The ferromagnetic segments 1010 may be formed of permanent magnet material as described in connection with ferromagnetic segments 210 of FIGS. 2A-2C herein. For example, ferromagnetic segments 1010 may be formed of one of the non-limiting examples of, iron, nickel, cobalt, neodymium (NdFeB) alloys, samarium cobalt (SmCo) alloys, alnico (AlNiCo) alloys, strontium ferrite, barium ferrite, etc.

Ferromagnetic segments 1010 may be manufactured using conventional methods of manufacturing permanent magnet materials. Alternatively or additionally, ferromagnetic segments 1010 may be manufactured using swaging methods as described in U.S. Patent Application Publication No.: 2019/0122818, filed Sep. 28, 2018 and titled "Method of Manufacturing Permanent Magnets," which is incorporated by reference herein in its entirety.

The magnetic assembly 1000 may also include non-ferromagnetic segments (not shown), in accordance with some embodiments of the technology described herein. The non-ferromagnetic segments may be formed of non-magnetic materials (e.g., plastic, fiberglass) as described in connection with non-ferromagnetic segments 220 of FIGS. 2A-2C. In some embodiments, the non-ferromagnetic segments may have the same size and shape as ferromagnetic segments 1010. Alternatively, the non-ferromagnetic segments may be differently sized and/or shaped than the ferromagnetic segments 1010. In some embodiments, the non-ferromagnetic segments may be filled with transparent materials or may be left open to provide holes for air flow.

In some embodiments, the ferromagnetic segments 1010 may be positioned along the common longitudinal direction A. The ferromagnetic segments 1010 may be positioned to provide a substantially homogenous magnetic field of a desired strength in the central region (e.g., the field of view (FOV) or imaging region) of the bore. Additionally, locations of ferromagnetic segments 1010 and non-ferromagnetic segments within each of the rods may be positioned to provide a magnetic field of a desired strength and homogeneity in the central region of the bore. For example, the $B_0$ magnetic field may have a homogeneity of 500 ppm over a volume having a diameter of approximately 20 cm (or any other diameter in the range of 15-25 cm). Alternatively, the $B_0$ magnetic field may have a homogeneity over a volume having a diameter of approximately 20 cm (or any other diameter in the range of 15-25 cm) in a range from 10 ppm to 1000 ppm, from 100 ppm to 500 ppm, from 500 ppm to 1000 ppm, from 200 ppm to 800 ppm, or any other suitable range within the aforementioned ranges. In some embodiments, the $B_0$ magnetic field within the central region of the bore of rectangular magnetic assembly 1000 may have a strength in a range from 0.05 T to 0.2 T. Alternatively or additionally, the $B_0$ magnetic field may have a strength in a range from 0.05 T and 0.1 T (e.g., 0.064 T).

In some embodiments, the bore of the magnetic assembly 1000 may have a circular cross-section with a width and height selected to accommodate a patient's head, arm, leg, hand, and/or foot. For example, to accommodate a patient's head, the bore of the magnetic assembly 1000 may have a circular cross-section with a width and a height of 36 cm. In such embodiments, the length of the circular magnetic assembly 1000 may be less than or equal to 45 cm and the gap between portions of the circular magnetic assembly 1000 on opposite sides of the bore may have a height of approximately 15 cm. For such dimensions, the magnetic assembly 1000 may comprise approximately 90 kg or less of permanent magnet material. Alternatively, for assemblies of other dimensions (e.g., to accommodate different portions of the patient's anatomy), the weight of the permanent magnet material may be in a range from 40 kg to 120 kg, from 60 kg to 80 kg, or within any range within those ranges. Additionally, the height of the gap between portions of the magnetic assembly may be within a range from 10 cm to 70 cm.

In some embodiments, panels 1030 or other substantially planar components may be positioned within gaps formed between ferromagnetic segments 1010 of the magnetic assembly 1000. Positioning the panels 1030 within such gaps allows for additional magnetic components to be brought closer to the imaging region without requiring fabrication of complicated, curved magnetic components configured to fit within the cylindrical bore. Thus, retaining the use of substantially planar panels 1030 may reduce manufacturing costs of other magnetic components for the MRI system. In some embodiments, panels 1030 may have a thickness of approximately 6 mm, or a thickness in a range from 4 mm to 12 mm, from 5 mm to 10 mm, and/or from 6 mm to 8 mm, or any range within those ranges.

As shown in the example of FIG. 10A, panels 1030 may be positioned substantially parallel to one another and on opposite sides of the bore. Panels 1030 may be positioned such that a layer of ferromagnetic components 1010 are positioned between each panel 1030 and the bore, in some embodiments. It should be appreciated that the symmetric arrangement of panels 1030 shown in the example FIG. 10A is not required of all embodiments and that some embodiments may have only one panel 1030, more than two panels 1030, or an asymmetric positioning of panels 1030.

In some embodiments, panels 1030 may comprise laminate panels with magnetics components formed thereon. Panels 1030 may include one or more $B_0$ coils, one or more gradient coils, one or more transmit/receive coils, and/or one or more shim coils, or any desired portions or combinations thereof may be fabricated on a single laminate panel or distributed between multiple laminate panels.

For example, panels 1030 may include a plurality of non-conductive layers and a plurality of conductive layers formed between the non-conductive layers. Connections between the conductive layers may be achieved by forming holes filled with a conductive material (e.g., plated through-holes) in the intervening non-conductive layers called "vias." Any number of non-conductive layers and conductive layers may be used to achieve a laminate panel according to a desired design.

Additionally, it should be appreciated that multiple conductive layers may be provided for each non-conductive layer, for example, a non-conductive layer having a conductive layer laminated to both sides. The multi-layer laminates may be attached using one or more adhesive layers. Adhesive layer(s) may be any suitable adhesive or combination of materials such as pre-preg, dry adhesive, epoxy and/or any other suitable layer or combination of layers that, when activated (e.g., via heat and/or pressure) bonds the multi-layer laminates together. It should be appreciated that any configuration of conductive and non-conductive layering, adhesives, etc., using any one or combination of lamination techniques may be used to produce a desired laminate panel.

As discussed above, layers of a laminate panel may be electrically connected using a desired arrangement of vias formed through appropriate layers in the laminate panel. In some embodiments, conductive traces may be formed by patterning copper conductors on non-conductive material and connected using vias between layers. The copper conductors may be patterned in any desired geometry and configured to form desired circuitry corresponding to one or more magnetic components (or portions thereof) of an MRI system and/or any supporting electronics, control electronics, etc. Copper conductors on different layers may be electrically connected using vias such as plated through-hole vias. It should be appreciated that vias may be formed through an entire laminate panel or may be formed through a subset of layers of a laminate panel, including to connect adjacent layers or multiple adjacent layers. A laminate layer of a laminate panel may contain multiple vias arranged to connect to different layers of the laminate panel. For example, a layer having multiple components or portions of multiple components can be electrically isolated from each other and independently connected to conductors patterned on other layers as appropriate. The conductors patterned on layers of a laminate panel may be connected in any way desired, and one or more layers may not include vias at all and therefore remain electrically isolated from other layers of the laminate panel.

Multiple components of an MRI system may be integrated on a single panel or distributed between multiple panels to facilitate manufacture of the components according to a desired configuration, as discussed in further detail below. For example, panels 1030 may include a plurality of $B_0$ layers having one or more $B_0$ coils formed thereon. The $B_0$ coils may be configured to generate at least a portion of a $B_0$ field for the MRI system when an appropriate current is applied to the coil(s). In some embodiments, each $B_0$ layer includes one or more turns of a conductive trace patterned on the conductive layer to generate a portion of a desired $B_0$ field. The $B_0$ coils may be patterned according to any desired geometry. For example, the $B_0$ coils may be patterned according to a generally circular geometry have one or more turns of conductive traces.

As discussed above, panels 1030 may further comprise at least one conductive layer patterned to form one or more gradient coils, or a portion of one or more gradient coils, capable of producing or contributing to magnetic fields suitable for providing spatial encoding of detected MR signals when operated in a low-field MRI system. For example, panels 1030 may include a plurality of laminate layers on which gradient coils are formed. The layer(s) may include a conductive trace patterned to form all or a portion of a Z-gradient coil, a conductive trace patterned to form all or a portion of a Y-gradient coil, and/or a conductive trace patterned to form all or a portion of an X-gradient coil. The gradient coils may be formed using any suitable geometry using any number and configuration of layers to provide the one or more desired gradient coils.

As one non-limiting example wherein gradient coils are at least partially formed in a laminate panel (e.g., panels 1030), a Z-gradient coil may be formed, at least in part, in one or more layers using a generally circular geometry and an X-gradient coil and a Y-gradient coil may be formed, at least in part, in one or more layers using a generally rectangular geometry such as via one or more conductors patterned as a grid. The conductors for the gradient coils may be distributed across one or multiple layers in any combination as desired to produce integrated gradient coils, either with or without other magnetic components of a low field MRI system, and either sharing layers with other magnetic components and/or patterned on separate layers of a laminate panel.

As also discussed above, a laminate panel may further comprise at least one conductive layer patterned to form one or more transmit and/or receive coils, or a portion of one or more transmit and/or receive coils, configured to stimulate MR response by producing a $B_1$ excitation field (transmit) and/or to receive emitted MR signals (receive) when operated in conjunction with the coils configured to produce a $B_0$ field and corresponding gradient fields. Such a laminate panel may incorporate single transmit and/or receive coils (or portions thereof) or multiple transmit and/or receive coils (or portions thereof) for performing single channel or parallel MRI.

Any suitable geometry may be used to pattern the transmit/receive coil or set of transmit/receive coils. For example, in some embodiments, a spiral-shape conductor may be patterned in one or more layers to form one or more transmit/receive coil (or portions thereof). According to some embodiments, a substantially rectangular geometry may be utilized to fabricate one or more transmit and/or receive coils using laminate techniques. According to some embodiments in which different coils are used for transmit and receive, transmit and receive coils may be formed in one or more layers using different respective geometries. In some embodiments, multiple layers and/or multiple laminate panels may be used to collectively form a transmit/receive coil and/or set of transmit/receive coils for use in a low field MRI system. It should be appreciated that one or more transmit/receive coils fabricated using laminate techniques may be utilized in connection with one or more other magnetic components fabricated using laminate techniques (e.g., by integrating the one or more other magnetic components in a shared or separate laminate panel), or may be utilized in connection with one or more other magnetic components fabricated using conventional techniques as part of a low field MRI system.

Shim coils arranged to facilitate the production of desired magnetic fields may also be patterned on one or more layers of a laminate panel (e.g., panels 1030). According to some embodiments, a laminate panel may comprise at least one conductive layer patterned to form one or more shim coils, or a portion of one or more shim coils, arranged to produce or contribute to magnetic field(s) and adapted to improve the homogeneity of the $B_0$ field generated by one or more $B_0$ coils, to otherwise improve the $B_0$ field within a given field of view and/or to counteract other magnetic fields that negatively impact the $B_0$ field. For example, panels 1030 may includes layer(s) on which one or more shim coils (or portions thereof) are formed. For embodiments that include a laminate panel with at least one $B_0$ coil and at least one shim coil, the at least one shim coil may be formed by conductive layers shared with (but electrically isolated from) the at least one $B_0$ coil (or portions thereof) or may be formed in one or more conductive layers separate from the at least one $B_0$ coil (or portions thereof). As with the other magnetic components discussed, shim coils fabricated using laminate techniques may be utilized with other components fabricated using laminate techniques (e.g., by integrating the shim coils in a shared or separate laminate panel) or utilized with other components manufactured using conventional techniques as part of a low field MRI system.

As discussed above, multiple low-field MRI components (or portions thereof) may be formed on a single layer (i.e., a single laminate layer) of a laminate panel (e.g., panels 1030). That is, multiple magnetic components or portions of multiple magnetic components may be patterned on the same conductive layer of a single laminate layer. For example, the conductive layer of a single laminate layer may be patterned to form one or more $B_0$ coils (either forming or contributing to a complete $B_0$ magnet) and one or more gradient coils or portion of one or more gradient coils. Aspects of forming such magnetics components using one or more laminate panels are described in U.S. Pat. No. 9,817,093, filed on Sep. 4, 2015, and titled "Low Field Magnetic Resonance Imaging Methods and Apparatus," which is incorporated herein by reference in its entirety.

Figure 10C:
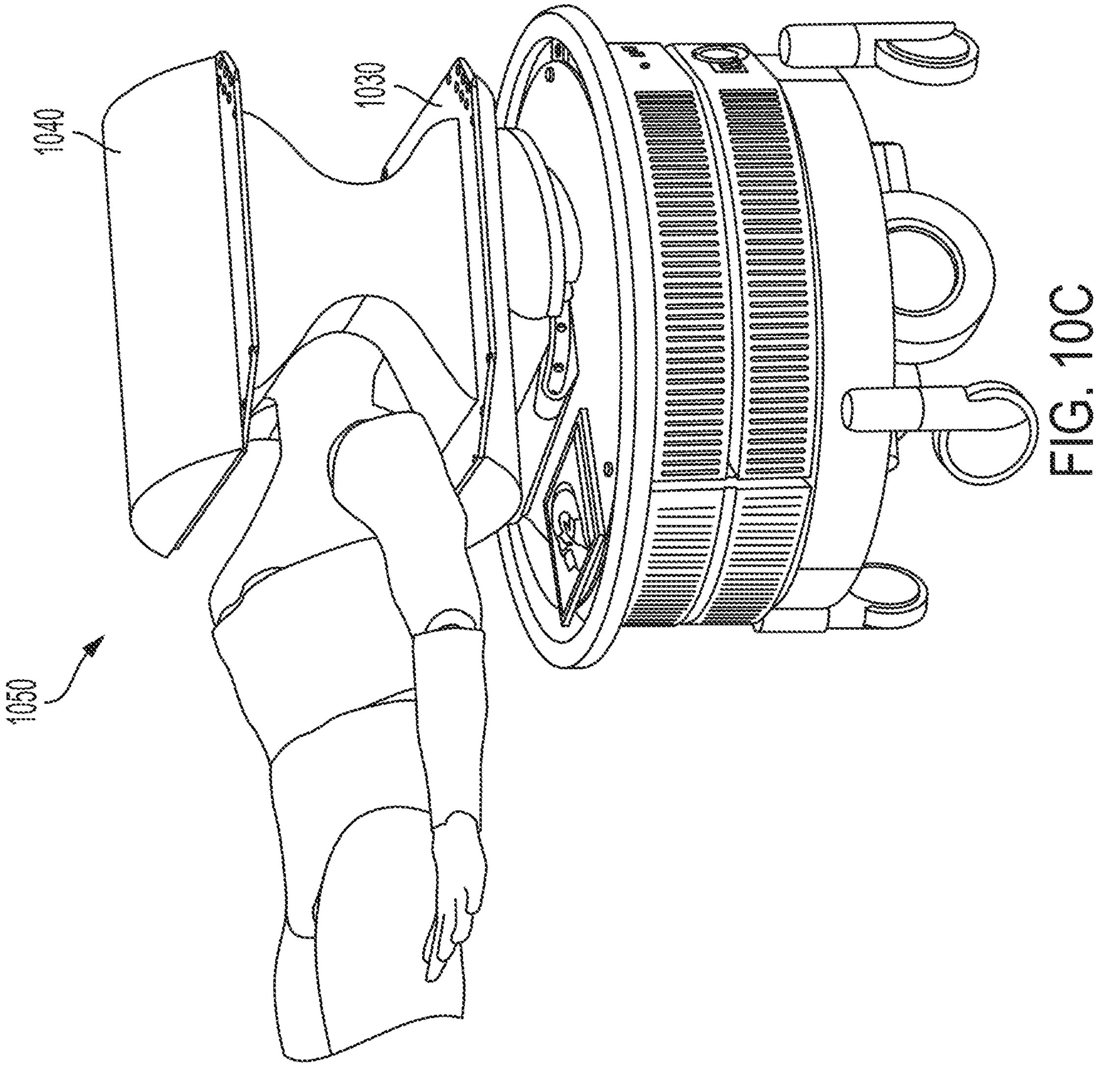
FIG. 10C illustrates the magnetic assembly of FIG. 10A as a part of an MRI system and being used to image a patient's head, in accordance with some embodiments of the technology described herein.

In some embodiments, ferromagnetic segments 1010 may be enclosed by a housing structure and incorporated into an MRI system, as shown in the example of FIG. 10C, where MRI system 1050 is depicted as being used to image a patient's head, in accordance with some embodiments of the technology described herein. The MRI system 1050 may include ferromagnetic segments 1010 (not shown) housed in housing components 1040 with panels 1030 inserted on opposite sides of the bore. In some embodiments, additional magnetic components (e.g., shim coils, transmit/receive coils) may be incorporated into panels 1030 or may be included as separate components within the bore of the MRI system 1050.

Figure 11A:
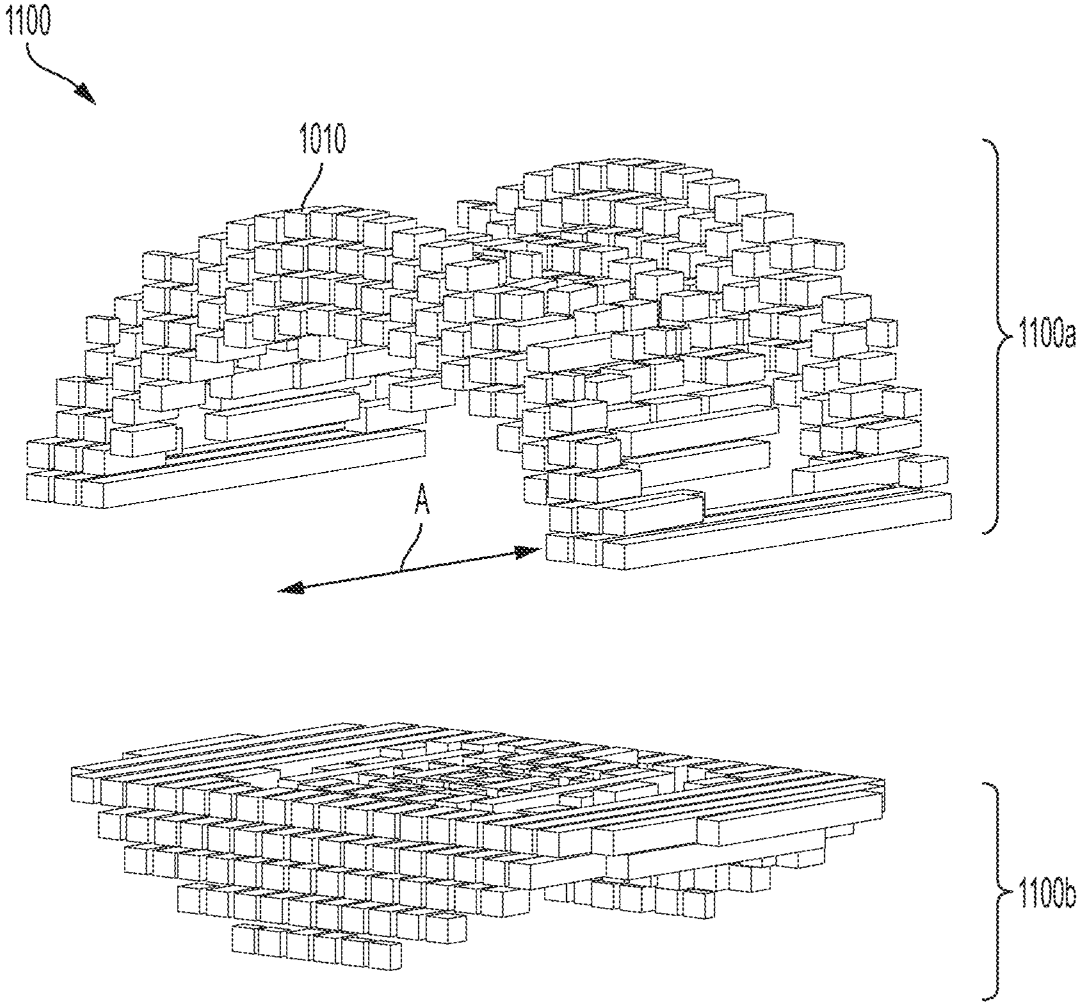
FIG. 11A illustrates an asymmetric magnetic assembly, in accordance with some embodiments of the technology described herein.
Figure 11B:
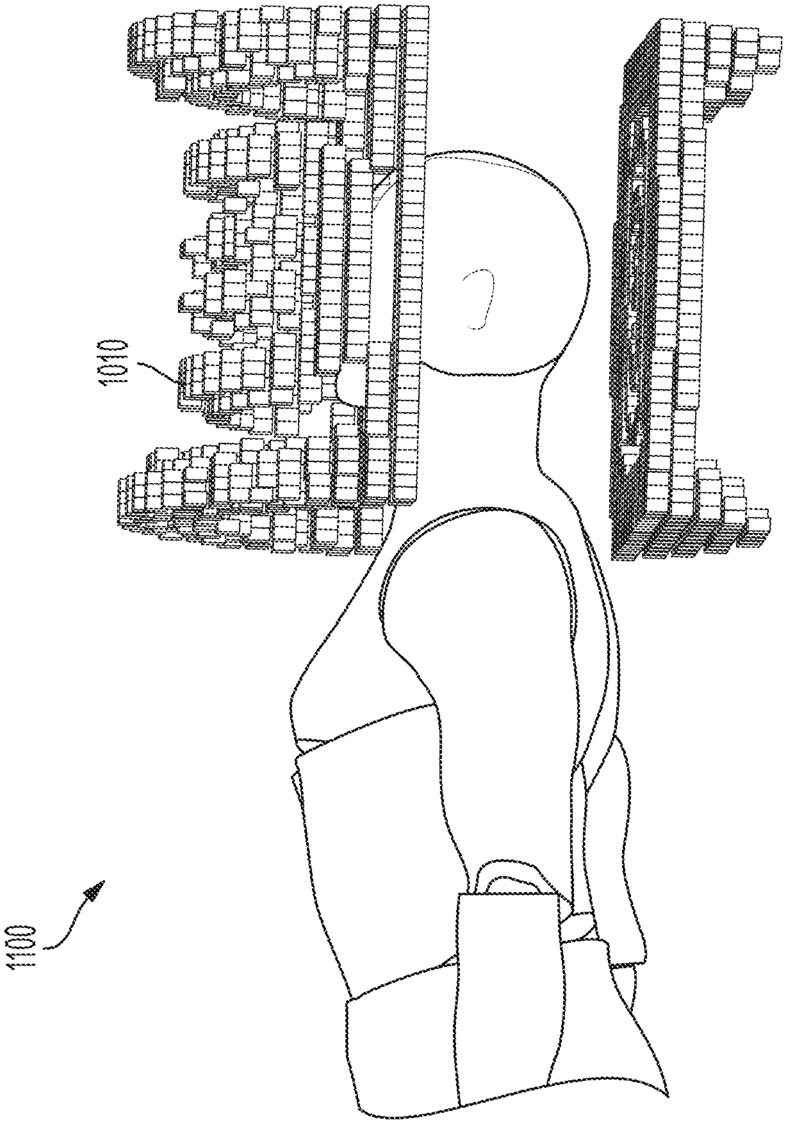
FIG. 11B illustrates the use of the magnetic assembly of FIG. 11A to image a patient's head, in accordance with some embodiments of the technology described herein.

FIG. 11A illustrates an embodiment of an asymmetric magnetic assembly 1100, and FIG. 11B illustrates the use of the asymmetric magnetic assembly 1100 to image a patient's head, in accordance with some embodiments of the technology described herein. The asymmetric magnetic assembly 1100 may be formed out of an asymmetric arrangement of ferromagnetic segments 1010. The ferromagnetic segments 1010 may be the same as those described in connection to the magnetic assembly 1000 of the examples of FIGS. 10A-10C.

In some embodiments, the ferromagnetic segments 1010 of the asymmetric magnetic assembly 1100 may be positioned to form a bore along a common longitudinal direction A. The ferromagnetic segments 1010 may be positioned in two asymmetric portions **1100*a* and 1100*b* on opposing sides of the bore. The asymmetric portions 1100*a* and 1100*b* may have different arrangements of ferromagnetic segments 1010. For example, portion 1100*a* may be shaped to provide a curved inner surface adjacent the bore (e.g., similar to a cylindrical bore) while portion 1100*b* may be shaped to provide a substantially flat inner surface adjacent the bore. The curved inner surface of portion 1100*a* may provide space to accommodate the patient's anatomy (e.g., the patient's head, leg, arm, foot, and/or hand) to be imaged while the flat inner surface of portion 1100*b*** may provide support to that portion or an adjoining portion of the patient's anatomy.

In some embodiments, the ferromagnetic segments 1010 may be positioned to provide a substantially homogenous magnetic field of a desired strength in the central region (e.g., the field of view (FOV) or imaging region) of the bore. Additionally, locations of ferromagnetic segments 1010 and non-ferromagnetic segments (not shown) within the asymmetric magnetic assembly 1100 may be positioned to provide a magnetic field of a desired strength and homogeneity in the central region of the bore. For example, the $B_0$ magnetic field may have a homogeneity of 500 ppm over a volume having a diameter of approximately 20 cm (or any other diameter in the range of 15-25 cm). Alternatively, the $B_0$ magnetic field may have a homogeneity over a volume having a diameter of approximately 20 cm (or any other diameter in the range of 15-25 cm) in a range from 10 ppm to 1000 ppm, from 100 ppm to 500 ppm, from 500 ppm to 1000 ppm, from 200 ppm to 800 ppm, or any other suitable range within the aforementioned ranges. In some embodiments, the $B_0$ magnetic field within the central region of the bore of rectangular magnetic assembly 1000 may have a strength in a range from 0.05 T to 0.2 T. Alternatively or additionally, the $B_0$ magnetic field may have a strength in a range from 0.05 T and 0.1 T (e.g., 0.064 T).

In some embodiments, the ferromagnetic segments 1010 of portion **1100*a* may be positioned to form a gap configured to accommodate insertion of a panel 1030 (not shown) to provide additional magnetic components for the MRI system as described in connection with FIGS. 10A-10C. In some embodiments, an opposing panel 1030 may be positioned on the substantially flat surface of portion 1100*b* of the asymmetric magnetic assembly 1100**.

In some embodiments, the bore of the asymmetric magnetic assembly 1100 may have an asymmetric cross-section with a width and height selected to accommodate a patient's head, arm, leg, hand, and/or foot. For example, to accommodate a patient's head, the bore of the asymmetric magnetic assembly 1100 may have a partially or semi-circular cross-section with radius of 18 cm on one side and a rectangular cross-section on the other side with a width of 36 cm positioned 14 cm from the center of the semi-circular portion of the bore. In such embodiments, the length of the asymmetric magnetic assembly 1100 may be less than or equal to 45 cm. For such dimensions, the asymmetric magnetic assembly 1100 may comprise approximately 85 kg or less of permanent magnet material, or 100 kg or less of permanent magnet material, or 120 kg or less of permanent magnet material. Alternatively, for assemblies of other dimensions (e.g., to accommodate smaller portions of the patient's anatomy), the weight of the permanent magnet material may be in a range from 50 kg to 120 kg, from 60 kg to 90 kg, or any range within those ranges.

Figure 12A:
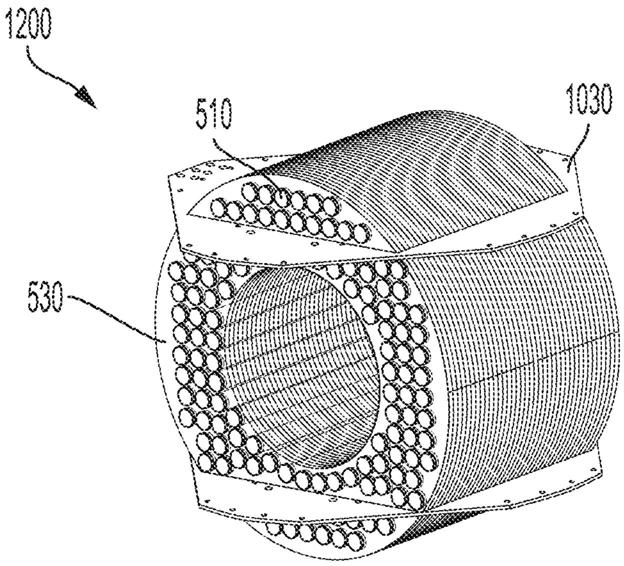
FIGS. 12A and 12B illustrate views of another embodiment of a magnetic assembly including gaps for accommodating gradient coils, in accordance with some embodiments of the technology described herein.
Figure 12B:
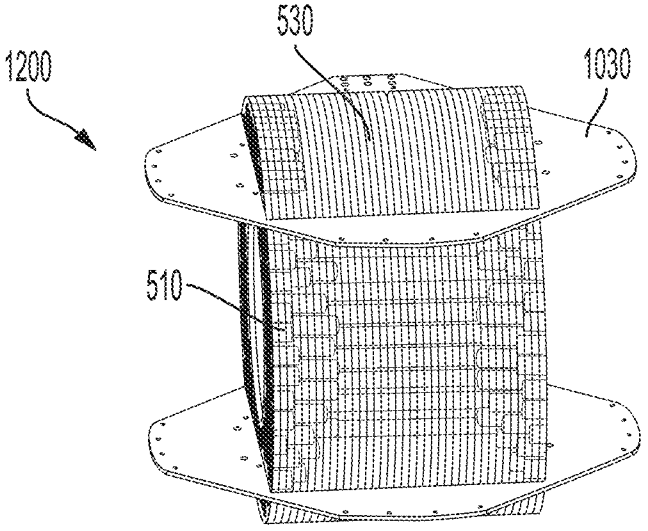

FIGS. 12A and 12B illustrate views of magnetic assembly 1200 including gaps for insertion of one or more panels, in accordance with some embodiments of the technology described herein. Magnetic assembly 1200 may be assembled in a manner similar to magnetic assemblies 500*a*, 500*b*, and 500*c* as described in connection with FIGS. 5A-5C. In some embodiments, magnetic assembly 1200 may include ferromagnetic segments 1210 positioned to form a bore extending a long a common longitudinal direction. Ferromagnetic segments 1210 may be formed of the same materials as and may be shaped in a same manner as ferromagnetic segments 210 of FIGS. 2A-2B.

In some embodiments, the magnetic assembly 1200 may include non-ferromagnetic sheets 1230. Non-ferromagnetic frame segments 1230 may be formed of same materials or in a same manner as non-ferromagnetic sheets 530 of FIGS. 5B-5C. Non-ferromagnetic sheets 1230 may be configured to house ferromagnetic segments 1210 and may be formed as annular and/or semi-annular slices of a hollow cylinder extending along the bore of magnetic assembly 1200. The non-ferromagnetic sheets 1230 may be glued together to form magnetic assembly 1200. Alternatively or additionally, the non-ferromagnetic sheets 1230 may be secured together to form magnetic assembly 1200 using threaded rods and suitable nuts.

In some embodiments, ferromagnetic segments 1210 may be positioned to accommodate the insertion of panels 1030 or other substantially planar components into respective gaps, as described in connection with the embodiments of FIGS. 10A-10C. Additionally, non-ferromagnetic sheets 1230 may be formed to provide space for panels 1030 in the gaps. For example, non-ferromagnetic sheets 1230 may be formed as annular rings and thereafter cut to create the gaps configured to accommodate panels 1030. Alternatively, non-ferromagnetic sheets 1230 may be formed as discrete segments and then assembled with gaps left between respective portions of the assembly to accommodate panels 1030 (e.g., secured in place using external fasteners).

Figure 13:
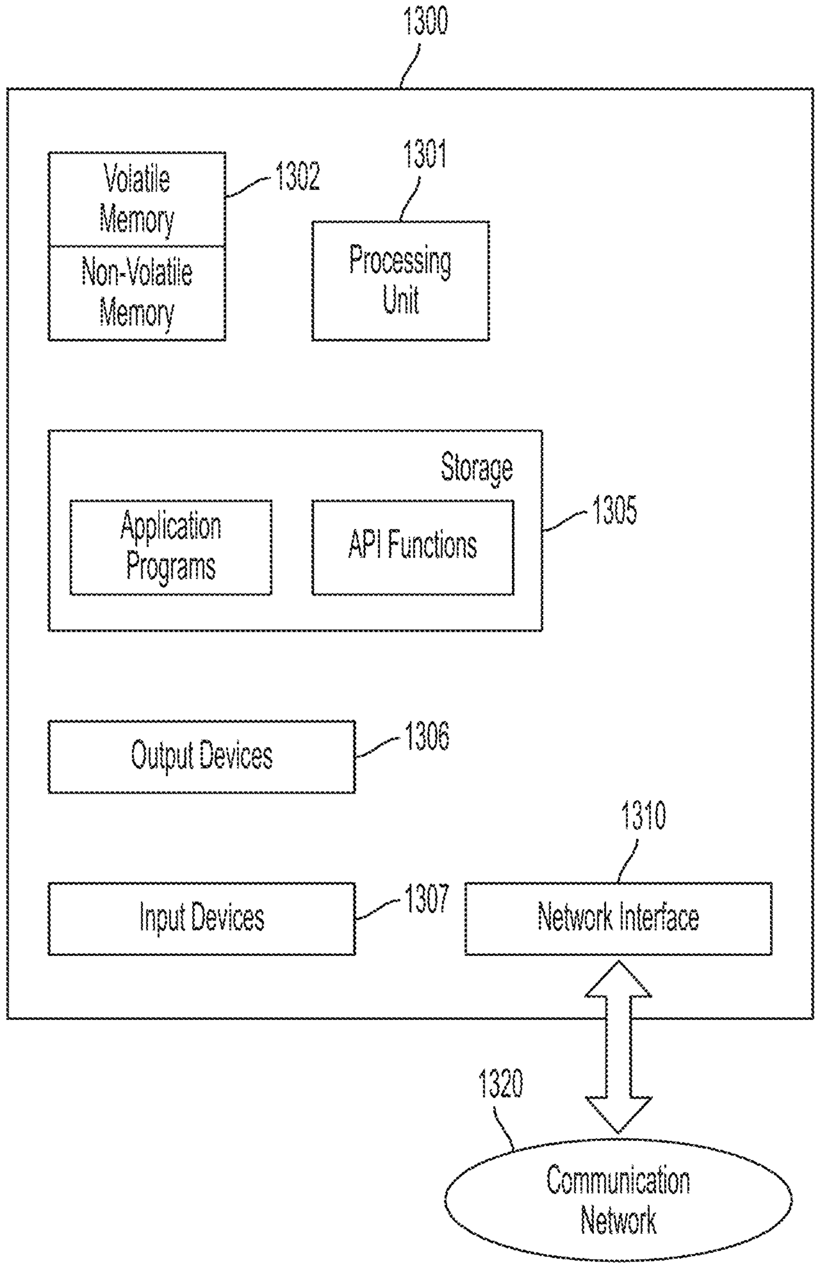
FIG. 13 depicts, schematically, an illustrative computing device on which aspects of the technology described herein may be implemented.

In the embodiment shown in FIG. 13, the computer 1300 includes a processing unit 1001 having one or more processors and a non-transitory computer-readable storage medium 1302 that may include, for example, volatile and/or non-volatile memory. The memory 1302 may store one or more instructions to program the processing unit 1301 to perform any of the functions described herein. The computer 1300 may also include other types of non-transitory computer-readable medium, such as storage 1305 (e.g., one or more disk drives) in addition to the system memory 1302. The storage 1305 may also store one or more application programs and/or resources used by application programs (e.g., software libraries), which may be loaded into the memory 1302.

The computer 1300 may have one or more input devices and/or output devices, such as devices 1306 and 1307 illustrated in FIG. 13. These devices can be used, among other things, to present a user interface. Examples of output devices that can be used to provide a user interface include printers or display screens for visual presentation of output and speakers or other sound generating devices for audible presentation of output. Examples of input devices that can be used for a user interface include keyboards and pointing devices, such as mice, touch pads, and digitizing tablets. As another example, the input devices 1307 may include a microphone for capturing audio signals, and the output devices 1306 may include a display screen for visually rendering, and/or a speaker for audibly rendering, recognized text. As another example, the input devices 1307 may include sensors (e.g., electrodes in a pacemaker), and the output devices 1306 may include a device configured to interpret and/or render signals collected by the sensors (e.g., a device configured to generate an electrocardiogram based on signals collected by the electrodes in the pacemaker).

As shown in FIG. 13, the computer 1300 may also comprise one or more network interfaces (e.g., the network interface 1310) to enable communication via various networks (e.g., the network 1320). Examples of networks include a local area network or a wide area network, such as an enterprise network or the Internet. Such networks may be based on any suitable technology and may operate according to any suitable protocol and may include wireless networks, wired networks or fiber optic networks. Such networks may include analog and/or digital networks.

Having thus described several aspects of at least one embodiment of this technology, it is to be appreciated that various alterations, modifications, and improvements will readily occur to those skilled in the art.

The above-described embodiments of the technology described herein can be implemented in any of numerous ways. For example, the embodiments may be implemented using hardware, software or a combination thereof. When implemented in software, the software code can be executed on any suitable processor or collection of processors, whether provided in a single computer or distributed among multiple computers. Such processors may be implemented as integrated circuits, with one or more processors in an integrated circuit component, including commercially available integrated circuit components known in the art by names such as CPU chips, GPU chips, microprocessor, microcontroller, or co-processor. Alternatively, a processor may be implemented in custom circuitry, such as an ASIC, or semi-custom circuitry resulting from configuring a programmable logic device. As yet a further alternative, a processor may be a portion of a larger circuit or semiconductor device, whether commercially available, semi-custom or custom. As a specific example, some commercially available microprocessors have multiple cores such that one or a subset of those cores may constitute a processor. Though, a processor may be implemented using circuitry in any suitable format.

Also, the various methods or processes outlined herein may be coded as software that is executable on one or more processors running any one of a variety of operating systems or platforms. Such software may be written using any of a number of suitable programming languages and/or programming tools, including scripting languages and/or scripting tools. In some instances, such software may be compiled as executable machine language code or intermediate code that is executed on a framework or virtual machine. Additionally, or alternatively, such software may be interpreted.

The techniques disclosed herein may be embodied as a non-transitory computer-readable medium (or multiple computer-readable media) (e.g., a computer memory, one or more floppy discs, compact discs, optical discs, magnetic tapes, flash memories, circuit configurations in Field Programmable Gate Arrays or other semiconductor devices, or other non-transitory, tangible computer storage medium) encoded with one or more programs that, when executed on one or more processors, perform methods that implement the various embodiments of the present disclosure described above. The computer-readable medium or media may be transportable, such that the program or programs stored thereon may be loaded onto one or more different computers or other processors to implement various aspects of the present disclosure as described above.

The terms "program" or "software" are used herein to refer to any type of computer code or set of computer-executable instructions that may be employed to program one or more processors to implement various aspects of the present disclosure as described above. Moreover, it should be appreciated that according to one aspect of this embodiment, one or more computer programs that, when executed, perform methods of the present disclosure need not reside on a single computer or processor, but may be distributed in a modular fashion amongst a number of different computers or processors to implement various aspects of the present disclosure.

Various aspects of the technology described herein may be used alone, in combination, or in a variety of arrangements not specifically described in the embodiments described in the foregoing and is therefore not limited in its application to the details and arrangement of components set forth in the foregoing description or illustrated in the drawings. For example, aspects described in one embodiment may be combined in any manner with aspects described in other embodiments.

Also, the technology described herein may be embodied as a method, examples of which are provided herein including with reference to FIG. 8. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

Use of ordinal terms such as "first," "second," "third," etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

The terms "approximately," "substantially," and "about" may be used to mean within ±20% of a target value in some embodiments, within ±10% of a target value in some embodiments, within ±5% of a target value in some embodiments, within ±2% of a target value in some embodiments. The terms "approximately," "substantially," and "about" may include the target value.

What is claimed is:

1. An assembly for providing a $B_0$ magnetic field in a portable magnetic resonance imaging (MRI) system, the assembly comprising:

a non-ferromagnetic frame defining a bore along a common longitudinal axis;

a plurality of ferromagnetic segments housed in the non-ferromagnetic frame, the ferromagnetic segments disposed about the bore in spaced relation along at least a portion of a circumference of the bore and extending along the common longitudinal axis, the ferromagnetic segments (i) having magnetization orientations that vary with their positions about the bore to provide a substantially homogeneous magnetic field within the bore, and (ii) arranged so that the assembly, when part of the portable MRI system, accommodates insertion of a patient's shoulder within a perimeter of the bore;

at least one gap formed in the non-ferromagnetic frame at a location spaced radially outward from the bore and extending along the common longitudinal axis; and a panel disposed in the at least one gap, wherein the panel comprises at least one of a gradient coil, a transmit RF coil, a receive RF coil, or a shim coil.

2. The assembly of claim 1, wherein the magnetization orientations are arranged in a Halbach or Halbach-like pattern.

3. The assembly of claim 1, wherein the assembly weighs less than 120 kg.

4. The assembly of claim 1, wherein the magnetization orientations vary according to both angular position around the bore and longitudinal position along the bore.

5. The assembly of claim 1, wherein the gap has a width sized for a laminate coil panel between 4 mm and 12 mm.

6. The assembly of claim 1, wherein the ferromagnetic segments are fixedly mounted to maintain their magnetization orientation pattern during movement of the MRI system between imaging locations.

7. The assembly of claim 1, wherein the substantially homogeneous magnetic field has a homogeneity of 100 ppm to 500 ppm over a volume having a diameter between 15 cm and 25 cm.

8. The assembly of claim 1, wherein the non-ferromagnetic frame fixedly secures the ferromagnetic segments and includes one or more mounting features for non-rotational attachment to a support structure of the portable MRI system.

9. A magnetic assembly for providing a $B_0$ magnetic field in a portable magnetic resonance imaging (MRI) system that is transportable between imaging locations without disassembly of the magnetic assembly, the magnetic assembly comprising:

a plurality of ferromagnetic segments housed in a non-ferromagnetic support frame, the ferromagnetic segments disposed about a bore along a common longitudinal axis, wherein the ferromagnetic segments are arranged to accommodate a patient's anatomy within the bore during imaging by the portable MRI system;

wherein the ferromagnetic segments have magnetization orientations that vary with their positions about the bore to provide a substantially homogeneous magnetic field within an imaging region situated within the bore;

wherein the non-ferromagnetic support frame fixedly secures the ferromagnetic segments and defines at least one axially extending gap spaced radially outward from the bore, the non-ferromagnetic support frame including one or more mounting features for non-rotational attachment to a support structure of the portable MRI system; and a panel disposed in the at least one axially extending gap, the panel comprising at least one of a gradient coil, a transmit RF coil, a receive RF coil, or a shim coil.

10. The magnetic assembly of claim 9, wherein the magnetization orientations are arranged in a Halbach or Halbach like pattern.

11. The magnetic assembly of claim 9, wherein the ferromagnetic segments are fixedly mounted to maintain their magnetization orientation pattern during movement of the MRI system between imaging locations.

12. The magnetic assembly of claim 9, wherein the magnetization orientations vary according to both angular position around the bore and longitudinal position along the bore.

13. The magnetic assembly of claim 9, wherein the magnetic assembly weighs less than 120 kg.

* * * * *